US012628432B2

(12) United States Patent
Lee et al.

(10) Patent No.: US 12,628,432 B2
(45) Date of Patent: May 12, 2026

(54) SEMICONDUCTOR DEVICE

(71) Applicant: Samsung Electronics Co., Ltd., Suwon-si (KR)

(72) Inventors: Jinmyoung Lee, Gumi-si (KR); Hyungsoon Jang, Hwaseong-si (KR); Baekyoung Kim, Hwaseong-si (KR); Hyunah Roh, Goyang-si (KR); Jongsoo Baek, Hwaseong-si (KR); Boyoung Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 612 days.

(21) Appl. No.: 17/972,180

(22) Filed: Oct. 24, 2022

(65) Prior Publication Data

US 2023/0223391 A1 Jul. 13, 2023

(30) Foreign Application Priority Data

Jan. 10, 2022 (KR) ........................ 10-2022-0003186

(51) Int. Cl.
*H10D 89/10* (2025.01)
*G06F 30/392* (2020.01)

(52) U.S. Cl.
CPC ........... *H10D 89/10* (2025.01); *G06F 30/392* (2020.01)

(58) Field of Classification Search
CPC ...... H10D 89/10; H10D 84/90; H10D 84/907; H10D 84/834; G06F 30/392
See application file for complete search history.

(56) References Cited

U.S. PATENT DOCUMENTS

| | | | |
|---|---|---|---|
| 6,093,214 | A | 7/2000 | Dillon |
| 7,281,230 | B2 | 10/2007 | Chung et al. |
| 7,653,885 | B2 | 1/2010 | Nandy et al. |
| 7,849,422 | B2 | 12/2010 | Sferrazza |
| 8,610,176 | B2 | 12/2013 | Patel et al. |
| 9,209,182 | B2 * | 12/2015 | Chern .................. H10D 84/856 |

(Continued)

FOREIGN PATENT DOCUMENTS

KR 10-1999-0066784 A 8/1999

OTHER PUBLICATIONS

Korean Office Action dated Dec. 3, 2025 issued in corresponding Korean Patent Application No. 10-2022-0003186.

*Primary Examiner* — Mounir S Amer
*Assistant Examiner* — Alexander Belousov
(74) *Attorney, Agent, or Firm* — HARNESS, DICKEY & PIERCE, P.L.C.

(57) ABSTRACT

A semiconductor device includes a substrate having first to fourth regions, first to third active regions and a first dummy active region extending on the first to fourth regions, respectively, a first gate structure intersecting the first active region on the first region and including a first gate conductive layer, a second gate structure intersecting the second active region on the second region and including a second gate conductive layer, a third gate structure intersecting the third active region on the third region find including a third gate conductive layer, a first dummy gate structure intersecting the first dummy active region on the fourth region and including a first dummy gate conductive layer, and source/drain regions on the first to third active regions and on both sides of the first to third gate structures.

20 Claims, 16 Drawing Sheets

(56) References Cited

U.S. PATENT DOCUMENTS

| | | | | |
|---|---|---|---|---|
| 9,299,700 B2 * | 3/2016 | Park | ..................... | H10D 84/038 |
| 9,330,978 B2 * | 5/2016 | Taniguchi | .......... | H10D 84/0135 |
| 9,336,348 B2 | 5/2016 | Hsieh et al. | | |
| 9,436,792 B2 | 9/2016 | Baek et al. | | |
| 9,601,489 B2 * | 3/2017 | Chern | ................. | H10D 64/514 |
| 9,711,505 B2 * | 7/2017 | Hong | .................. | H10D 64/667 |
| 10,177,148 B2 * | 1/2019 | Ha | ....................... | H10D 30/795 |
| 10,461,078 B2 | 10/2019 | Wen et al. | | |
| 10,741,669 B2 * | 8/2020 | Leib | ..................... | H10D 62/115 |
| 10,978,453 B2 * | 4/2021 | Ha | ....................... | H10D 64/017 |
| 11,055,465 B2 * | 7/2021 | Wolpert | ................ | G06F 30/398 |
| 11,056,395 B2 * | 7/2021 | Wu | ...................... | H10D 30/024 |
| 11,094,598 B2 | 8/2021 | Krishnan et al. | | |
| 11,296,202 B2 * | 4/2022 | Liaw | ..................... | H10B 10/12 |
| 11,315,922 B2 * | 4/2022 | Greene | ............. | H10D 84/0135 |
| 11,342,445 B2 * | 5/2022 | Leib | .................. | H01L 21/76224 |
| 11,756,999 B2 * | 9/2023 | Yang | .................. | H10D 84/0193 |
| | | | | 257/369 |
| 11,757,014 B2 * | 9/2023 | Liaw | ..................... | H10B 10/12 |
| | | | | 257/369 |
| 11,894,376 B2 * | 2/2024 | Ha | ..................... | H10D 30/0245 |
| 12,057,487 B2 * | 8/2024 | Liaw | .................... | H10D 64/667 |

| | | | | |
|---|---|---|---|---|
| 2011/0074498 A1 * | 3/2011 | Thompson | ......... | H10D 84/0167 |
| | | | | 257/E21.409 |
| 2011/0272815 A1 * | 11/2011 | Misaka | ................. | G06F 30/392 |
| | | | | 257/773 |
| 2015/0143309 A1 * | 5/2015 | De Dood | ............. | G06F 30/398 |
| | | | | 716/107 |
| 2015/0325575 A1 * | 11/2015 | Park | ..................... | H10D 62/116 |
| | | | | 257/401 |
| 2016/0086863 A1 * | 3/2016 | Won | ................... | H10D 84/0149 |
| | | | | 438/197 |
| 2017/0033217 A1 * | 2/2017 | Hong | .................... | H10D 30/62 |
| 2018/0040620 A1 * | 2/2018 | Ha | ....................... | H10D 86/011 |
| 2019/0109137 A1 * | 4/2019 | Ha | ....................... | H01L 21/266 |
| 2019/0164968 A1 * | 5/2019 | Leib | ................. | H01L 21/02636 |
| 2019/0371783 A1 * | 12/2019 | Lo | ......................... | G06F 30/392 |
| 2020/0098681 A1 * | 3/2020 | Kim | ................... | H01L 23/5286 |
| 2020/0335603 A1 * | 10/2020 | Leib | ................. | H10D 84/0172 |
| 2021/0202482 A1 * | 7/2021 | Ha | ....................... | H10D 62/113 |
| 2021/0313333 A1 * | 10/2021 | Liaw | .................... | H10D 30/43 |
| 2022/0231145 A1 * | 7/2022 | Liaw | .................... | H10D 64/665 |
| 2023/0223391 A1 * | 7/2023 | Lee | ....................... | H10D 89/10 |
| | | | | 257/401 |
| 2023/0369434 A1 * | 11/2023 | Liaw | ................... | H10D 64/667 |

* cited by examiner

<TABLE1>

|         | M1  | M2  | M3  | M4  |
|---------|-----|-----|-----|-----|
| TR1     | ×   | O   | ×   | O   |
| TR2     | O   | O   | ×   | O   |
| TR3     | ×   | O   | O   | ×   |
| TR4     | O   | O   | ×   | ×   |
| TR5     | ×   | ×   | ×   | ×   |
| TR6     | O   | ×   | ×   | ×   |
| D1(TR1) | ×   | O   | ×   | O   |
| D2(TR1) | ×   | O   | ×   | O   |
| D3(TR2) | O   | O   | ×   | O   |
| D4(TR2) | O   | O   | ×   | O   |
| MASK DENSITY | 50% | 80% | 10% | 60% |

<TABLE2>

|         | M1  | M2  | M3  | M4  |
|---------|-----|-----|-----|-----|
| TR1     | ×   | O   | ×   | O   |
| TR2     | O   | O   | ×   | O   |
| TR3     | ×   | O   | O   | ×   |
| TR4     | O   | O   | ×   | ×   |
| TR5     | ×   | ×   | ×   | ×   |
| TR6     | O   | ×   | ×   | ×   |
| D1      | O   | O   | O   | O   |
| D2      | O   | ×   | O   | O   |
| D3      | ×   | ×   | O   | O   |
| D4      | ×   | ×   | O   | ×   |
| MASK DENSITY | 50% | 50% | 50% | 50% |

FIG. 3

SEMICONDUCTOR DEVICE

CROSS-REFERENCE TO RELATED APPLICATION(S))

This application claims benefit of priority to Korean Patent Application No. 10-2022-0003186 filed on Jan. 10, 2022 in the Korean Intellectual Property Office, the disclosure of which is incorporated herein by reference in its entirety.

BACKGROUND

The present inventive concepts relate to semiconductor devices.

In line with growing demand for high performance, high speed, and/or multifunctionality of semiconductor devices, the degree of integration of semiconductor devices has increased. With the trend for high integration of semiconductor devices, scaling down of transistors in semiconductor devices has been accelerated, and methods for forming transistors capable of providing various operating voltages, while having a reduced size, have been researched.

SUMMARY

An aspect of the present inventive concepts is to provide semiconductor devices having improved electrical characteristics and production yield.

According to an aspect of the present inventive concepts, a semiconductor device includes a substrate having first to fourth regions, a first active region, a second active region, and a third active region extending on the first to third regions, respectively, a first dummy active region extending on the fourth region, a first gate structure intersecting the first active region on the first region and including a first gate conductive layer, a second gate structure intersecting the second active region on the second region and including a second gate conductive layer, a third gate structure intersecting the third active region on the third region and including a third gate conductive layer, a first dummy gate structure intersecting the first dummy active region on the fourth region and including a first dummy gate conductive layer to which an electrical signal is not applied, and source/drain regions on the first to third active regions and on both sides of the first to third gate structures, wherein the first dummy gate conductive layer has a thickness that is different from thicknesses of the first to third gate conductive layers.

According to another aspect of the present inventive concepts, a semiconductor device includes a substrate, a plurality of circuit function blocks including a plurality of standard cells and a plurality of filler cells interposed between the plurality of standard cells spaced apart from each other on the substrate and configured to perform different circuit functions, respectively, and a dummy structure between the plurality of circuit function blocks on the substrate, wherein the plurality of standard cells each include an active region, a gate structure intersecting the active region, and source/drain regions on the active region and on both sides of the gate structure, the plurality filler cells each include a first dummy active region and a first dummy gate structure intersecting the first dummy active region, the dummy structure includes a second dummy active region and a second dummy gate structure intersecting the second dummy active region, and the gate structure has a structure that is different from at least one of the first dummy gate structure or the second dummy gate structure.

According to another aspect of the present inventive concepts, a semiconductor device includes a substrate having first to fourth regions, a first gate structure on the first region, the first gate structure including a sequentially stacked structure of a gate dielectric layer, a first gate conductive layer, and an upper conductive layer, a gate capping layer on the upper conductive layer, and gate spacer layers on sidewalls of the gate dielectric layer, a second gate structure on the second region, the second gate structure including a sequentially stacked structure of the gate dielectric layer, a second gate conductive layer, and the upper conductive layer, the gate cupping layer on the upper conductive layer, and the gate spacer layers on the sidewalls of the gate dielectric layer, a third gate structure on the third region, the third gate structure including a sequentially stacked structure of the gate dielectric layer, a third gate conductive layer, and the upper conductive layer, the gate capping layer on the upper conductive layer, and the gate spacer layers on the sidewalls of the gate dielectric layer, and a dummy gate structure on the fourth region, the dummy gate structure including a sequentially stacked structure of the gate dielectric layer, a dummy gate conductive layer, and the upper conductive layer, the gate capping layer on the upper conductive layer, and the gate spacer layers on the sidewalls of the gate dielectric layer, wherein the first to third gate conductive layers and the dummy gate conductive layer include a same material, and the first to third gate conductive layers and the dummy gate conductive layer have thicknesses different from each other.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 2 and 3 are a block diagram and tables illustrating a method of verifying a mask density of a semiconductor device according to an example embodiment:

DETAILED DESCRIPTION

Hereinafter, some example embodiments of the present inventive concepts will be described with reference to the accompanying drawings.

While the term "same" or "uniform" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
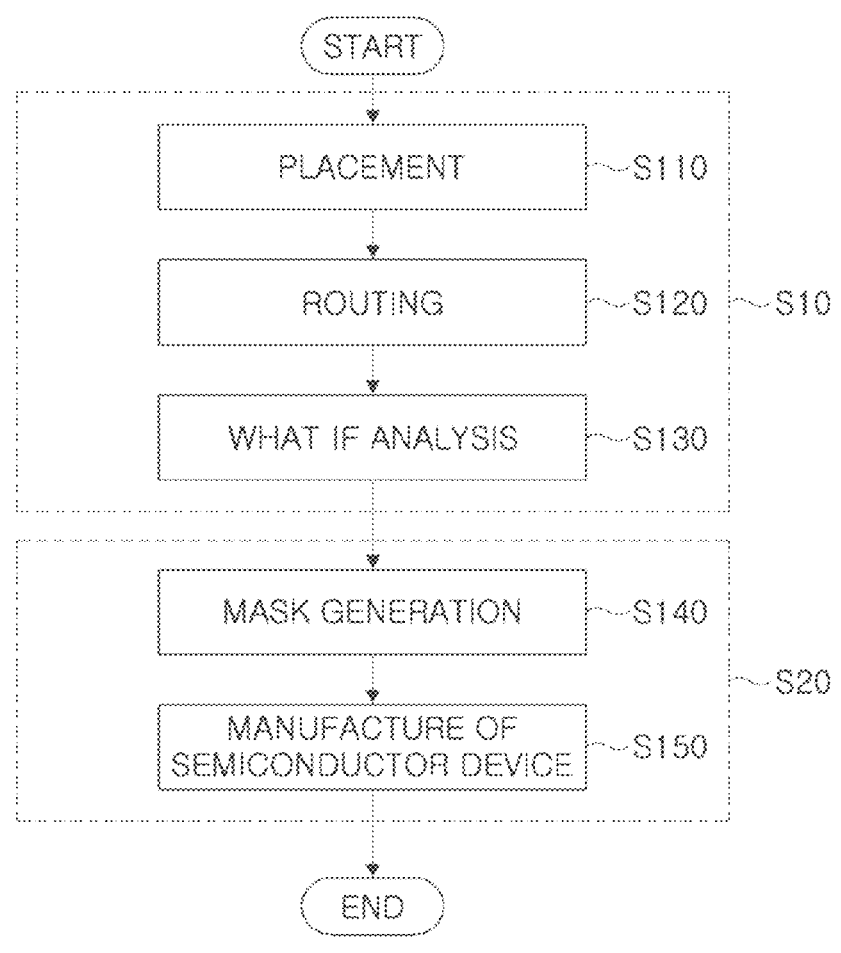
FIG. 1 is a flowchart illustrating a method of designing and manufacturing a semiconductor device according to an example embodiment.

FIG. 1 is a flowchart illustrating a method of designing and manufacturing a semiconductor device according to an example embodiment.

Referring to FIG. 1, a method of designing and manufacturing a semiconductor device may include a semiconductor device designing operation S10 and a semiconductor device manufacturing process operation S20. The semiconductor device designing operation S10 is an operation of designing a layout for a circuit, and may be implemented by a program including a plurality of instructions. That is, the semiconductor device designing operation S10 may be a computer implemented operation for designing a circuit. The semiconductor device manufacturing process operation S20 may be an operation of manufacturing a semiconductor device based on a designed layout, and may be performed in a semiconductor process module.

The semiconductor device designing operation S10 may include a placement operation S110, a routing operation S120, and a what-if-analysis operation S130.

In an example embodiment, the designing operation S10 may further include a plane arrangement operation and a power arrangement operation performed before the placement operation S110. The plane arrangement operation may be an operation of physically designing a logically designed schematic circuit by cutting and moving the schematic circuit. In the plane arrangement operation, a memory or a circuit function block may be arranged. The power arrangement operation may be an operation of disposing patterns of wirings connecting a local power, for example, a driving voltage or a ground, to the arranged circuit function blocks.

The placement operation S110 is an operation of arranging patterns of elements constituting the circuit function block, and may include an operation of arranging standard cells from a plurality of cell libraries. In some example embodiments, each of the standard cells may include semiconductor devices and lower wiring lines of at least one layer connected thereto. Empty regions may occur between the standard cells disposed in this operation, and the empty regions may be filled with filler cells. Unlike standard cells including operable semiconductor devices and unit circuits implemented with semiconductor devices, the filler cells may be dummy regions. In addition, other empty regions except for the circuit function block may form a dummy region together with the filler cells. By this operation, a shape or size of a pattern for constituting the transistors and wirings to be actually formed on the silicon substrate may be defined. For example, in order to form an inverter circuit on an actual silicon substrate, layout patterns such as PMOS, NMOS, N-WELL, gate electrode, and wirings to be dispersed thereon may be appropriately arranged.

The routing operation S120 may be an operation of generating an upper wiring structure including upper wirings of an upper layer connecting the arranged standard cells. The upper wirings may be electrically connected to lower wirings in the standard cells, and may electrically connect the standard cells to each other. The upper wirings may be configured to be physically formed on top of the lower wirings.

The what-if-analysis operation S130 may be an operation of verifying and correcting the generated layout. Verification items may include design rule check (DRC) verifying whether a layout is correct in accordance with a design rule, electronical rule check (ERC) verifying whether a layout is correct without electrical breakage inside, and layout vs schematic (LVS) verifying whether a layout matches a gate level net list.

In an example embodiment, the what-if-analysis operation S130 may further include verifying a mask density according to the design rule. The mask density may refer to a planar area of an open region compared to the entire mask planar area or a planar area of a closed region compared to the entire mask planar area. A semiconductor process may be performed by a plurality of masks, and a production yield may be changed according to a density of each mask. The semiconductor process may include, for example, an exposure process, a deposition process, an etching process, or a cleaning process. A target for verifying the mask density in the what-if-analysis operation S130 may be masks related to a gate structure generated by a replacement process from a sacrificial gate structure, for example, a replacement metal gate (RMG), but the present inventive concepts are not limited thereto and may be applied to other masks.

In an example embodiment, the what-if-analysis operation S130 may further include verifying the density of each mask and then changing the design rule related to the mask to have a desired (or alternatively, optimized) density. The range of the desired (or alternatively, optimized) density may be variously set, and, for example, may be in the range of about 45% to about 55%.

The semiconductor device manufacturing process operation S20 may include a mask generating operation S140 and a semiconductor device manufacturing operation S150.

The mask generating operation S140 may include generating mask data for forming various patterns on a plurality of layers by performing optical proximity correction (OPC) on the layout data generated in the semiconductor device designing operation (S10) and manufacturing a mask using the mask data. The optical proximity correction may be for correcting distortion that may occur during a photolithography process. The mask may be manufactured in a manner of depicting layout patterns using a thin chrome film applied to a glass or quartz substrate. In this operation, a plurality of masks having a desired (or alternatively, optimized) mask density may be generated using a design rule changed in the what-if-analysis operation S130.

In the semiconductor device manufacturing operation S150, various types of exposure and etching processes may be repeatedly performed using the plurality of masks. Through these processes, shapes of patterns configured during layout design may be sequentially formed on a semiconductor substrate. For example, various semiconductor processes are performed on a semiconductor substrate, such as a wafer, using a plurality of masks to form a semiconductor device in which an integrated circuit (IC) is implemented.

Figure 2:
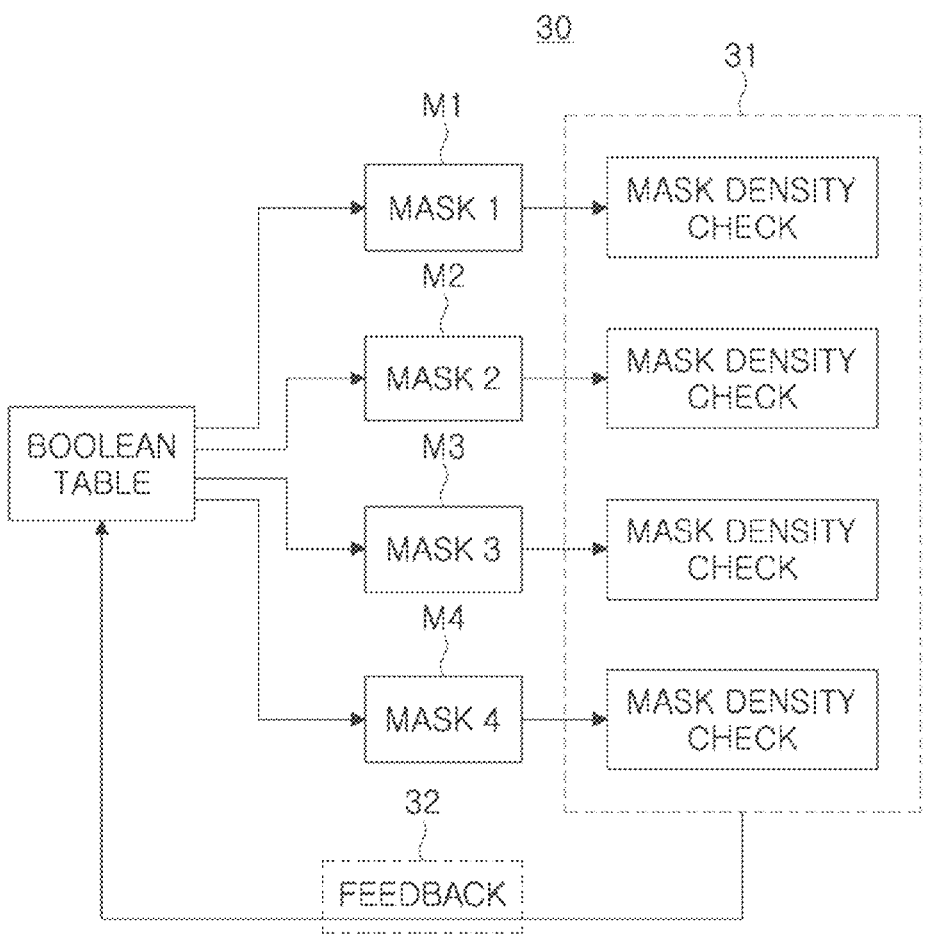

FIGS. 2 and 3 are a block diagram and tables illustrating a method of verifying a mask density of a semiconductor device according to an example embodiment. A mask density verification method 30 of a semiconductor device according to an example embodiment may relate to one of verification items of the what-if-analysis operation S130 of the semiconductor device designing operation described above with reference to FIG. 1.

Referring to FIG. 2, layout data for generating a mask may include a Boolean table. The Boolean table may be data defining a shape of each of the plurality of masks M1, M2, M3, and M4.

In an example embodiment, the plurality of masks M1, M2, M3, and M4 may include a first mask M1, a second mask M2, a third mask M3, and a fourth mask M4. Hereinafter, the plurality of masks M1, M2, M3, and M4 are described based on four masks, but the number of masks may be variously changed.

The Boolean table may include a table for determining whether to open each of the plurality of masks M1, M2, M3, and M4 in units of standard cells and/or filler cells. Accordingly, a mask density of each of the plurality of masks M1, M2, M3, and M4, for example, a planar area of the open region compared to the mask planar area may be calculated using the Boolean table.

In the mask density verification method 30, after performing a mask density check operation 31 of determining whether a mask density is optimized or in a desirable density range, if a corresponding mask is not optimized or not in the desirable density range, a feedback operation 32 of changing the Boolean table by resetting whether to open a filler cell region or the like may be performed. In an example embodiment, the mask density check operation 31 may include determining whether each of the plurality of masks M1, M2, M3, and M4 is within a desired (or alternatively, optimized) density range. The desired (or alternatively, optimized) density range may be arbitrarily designated, for example, the range of 45% to 55% may be designated as being desirable or optimized. Feedback operation 32 may include modifying the Boolean table for masks that are not within the desired (or alternatively, optimized) density range.

FIG. 3 may be a diagram illustrating an embodiment of a method of modifying the Boolean table in feedback operation 32. Referring to FIG. 3. 'TABLE 1' may illustrate an example of a Boolean table before feedback operation 32, and 'TABLE 2' may illustrate an example of a Boolean table after feedback operation 32. 'o' may mean that a mask portion overlapping a region rat the horizontal axis is 'opened', and 'x' may mean that the mask portion overlapping the region on the horizontal axis is 'closed'. For convenience of explanation, it is assumed that each region of the horizontal axis has the same area, and 'mask density' refers to '(the number of 'o' in each mask)/10'.

In an example embodiment, first to sixth transistor regions TR1, TR2, TR3, TR4, TR5, and TR6, among the regions on the horizontal axis, may refer to respective standard cell regions in which different transistors are disposed. For example, the first transistor region TR1 may correspond to standard cell regions in which first transistors are disposed, the second transistor region TR2 may correspond to standard cell regions in which second transistors are disposed, the third transistor region TR3 may correspond to standard cell regions in which third transistors are disposed, the fourth transistor region TR4 may correspond to standard cell regions in which fourth transistors are disposed, and the fifth transistor region TR5 may correspond to standard cell regions in which fifth transistors are disposed, and the sixth transistor region TR6 may correspond to standard cell regions in which sixth transistors are disposed. The first to sixth transistors may be transistors having different threshold voltages.

In an example embodiment, first to fourth dummy regions D1, D2, D3, and D4, among the regions on the horizontal axis, may refer to filler cell regions between standard cells or dummy regions disposed outside the circuit function block. The first to fourth dummy regions D1, D2, D3, and D4 may be regions spaced apart from each other. In the example embodiment, the number of transistor regions and the number of dummy regions are described as 6 and 4, respectively, but may be variously changed otherwise.

Referring to 'TABLE 1' in each of the transistor regions TR1, TR2, TR3, TR4, TR5, and TR6, whether the first to fourth masks M1, M2, M3, and M4 are opened may vary to form gate structures having different threshold voltages. For example, the first transistor region TR1 may be formed as a process is performed with the first and third masks M1 and M3 closed and the second and fourth masks M2 and M4 opened. In each of the dummy regions D1, D2, D3, and D4, whether masks are opened may be set in the same manner as that of one of the first to sixth transistor regions TR1, TR2, TR3, TR4, TR5, and TR6. For example, in the first dummy region D1, whether the mask is opened may be set in the same manner as that in the first transistor region TR1. Accordingly, the first dummy region D1 may be set such that the first and third masks M1 and M3 are closed and die second and fourth masks M2 and M4 are opened. Each of the plurality of masks M1, M2, M3, and M4 may not be optimized with various mask density ranges from 0% to 100%.

Referring to 'TABLE 2' whether the first to fourth masks M1, M2, M3, and M4 for each of the transistor regions TR1, TR2, TR3, TR4, TR5, and TR6 are opened may not be changed. Meanwhile, whether the first to fourth masks M1, M2, M3, and M4 for each of the dummy regions D1, D2, D3, and D4 are opened may be changed or reset. Accordingly, the Boolean table may be modified so that the mask density of each of the plurality of masks M1, M2, M3, and M4 is within a desired (or alternatively, optimization) range.

As whether the plurality of masks M1, M2, M3, and M4 of the dummy regions D1, D2, D3, and D4 are opened is arbitrarily changed for optimization of the mask density or for a desirable mask density, at least some of the dummy regions D1, D2, D3, and D4 may be laid out to form a stack having a structure, different from that of the transistor regions TR1, TR2, TR3, TR4, TR5, and TR6. For example, the first dummy region D1 is set so that all of the first to fourth masks M1, M2, M3, and M4 are opened to proceed with a process, while the first to sixth transistor regions TR1, TR2, TR3, TR4, TR5, and TR6 may not be set so that all of the first to fourth masks M1, M2, M3, and M4 are opened to proceed with a process. Accordingly, a stack structure formed in the first dummy region D1 may have a different stack structure from a stack structure formed in the transistor regions TR1, TR2, TR3, TR4, TR5, and TR6.

Figure 4:
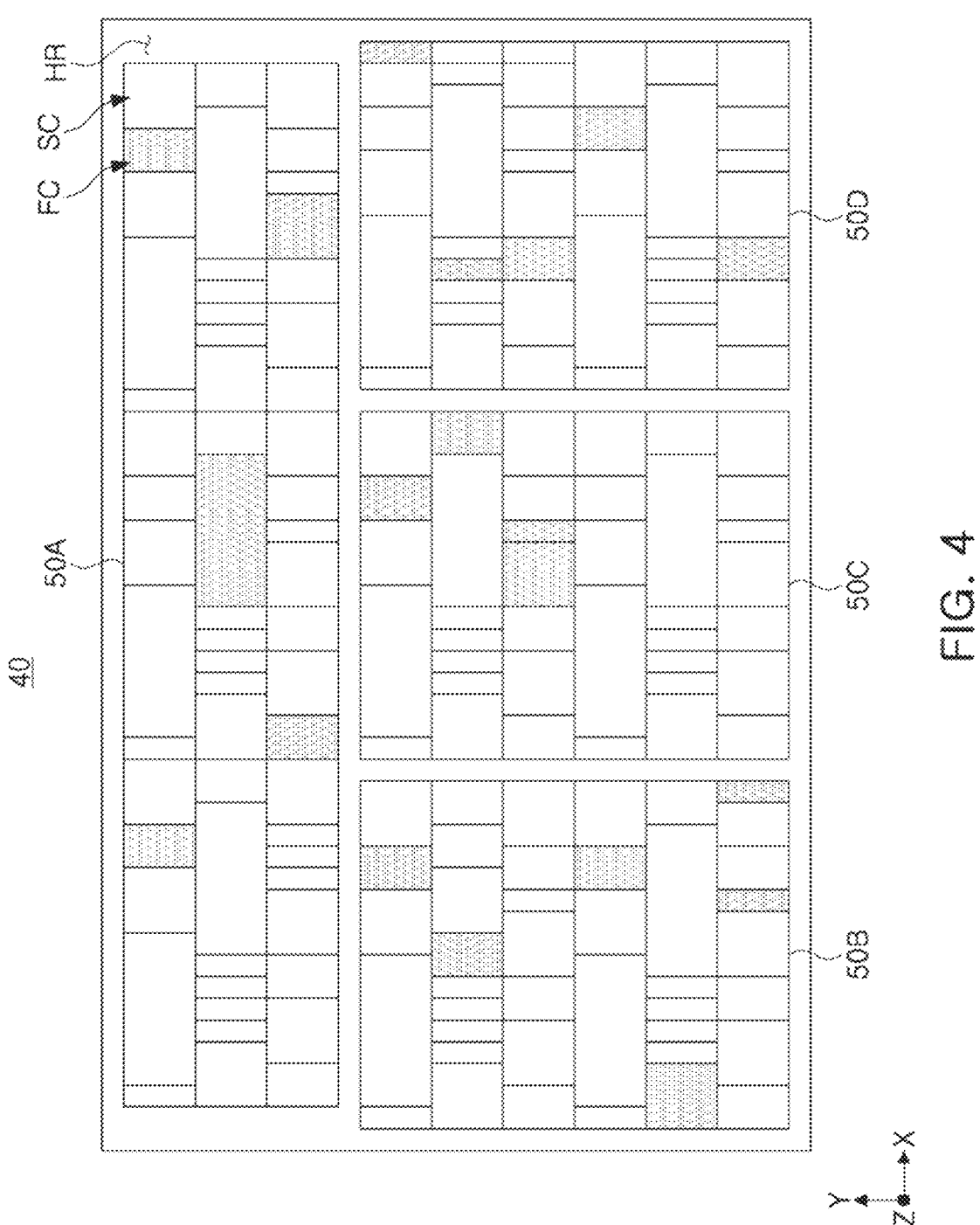
FIG. 4 is a schematic layout diagram of a semiconductor device according to an example embodiment.

FIG. 4 is a schematic layout diagram of a semiconductor device according to an example embodiment.

Referring to FIG. 4, a layout diagram 40 of a semiconductor device may include circuit function blocks 50A, 50B, 50C, and 50D. Each of the circuit function blocks 50A, 50B, 50C, and 50D may include a plurality of rows arranged in one direction, for example, a Y-direction. In each row, standard cells SC may be arranged in a line in one direction, for example, the X-direction. Standard cells from different cell libraries may be disposed in the plurality of rows, and standard cells from the same cell library may be disposed in each of the plurality of rows. However, the type and arrangement relationship of standard cells may be variously changed according to example embodiments. Filler cells FC may be further disposed between some of the standard cells SC. The size, arrangement, and number of the filler cells FC may be variously changed according to example embodiments.

Each of the circuit function blocks 50A, 50B, 50C, and 50D may be surrounded by a halo region HR. The halo region HR may be an empty region in which components constituting a circuit are not disposed. Accordingly, the circuit function blocks 50A, 50B, 50C, and 50D may be distinguished from each other not only functionally but also physically.

Referring to FIGS. 2 and 3 together, the mask density verification method 30 may include feedback operation 32 of changing whether to open a mask portion overlapping the filler cells FC or a halo region HR, without changing whether to open a mask portion overlapping the standard cells SC, for each of the plurality of masks M1, M2, M3, and M4. Accordingly, a production yield and electrical characteristics of the semiconductor device may be improved by optimizing the mask density of each of the plurality of masks M1, M2, M3, and M4 (or by adjusting the mask density of each of the plurality of masks M1, M2, M3, and M4 to a desirable density range).

Figure 5:
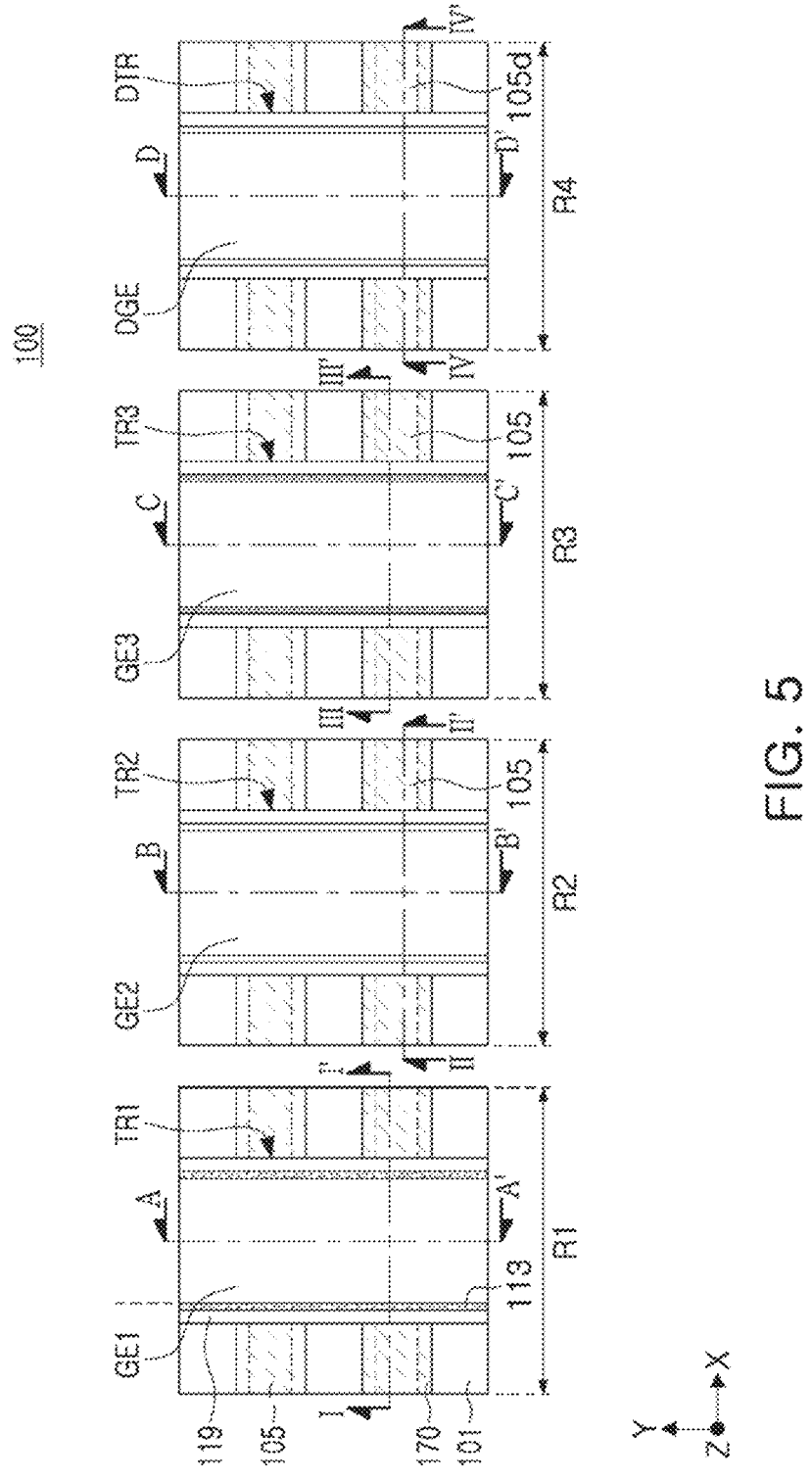
FIG. 5 is a schematic plan view of a semiconductor device according to an example embodiment.
Figure 6:
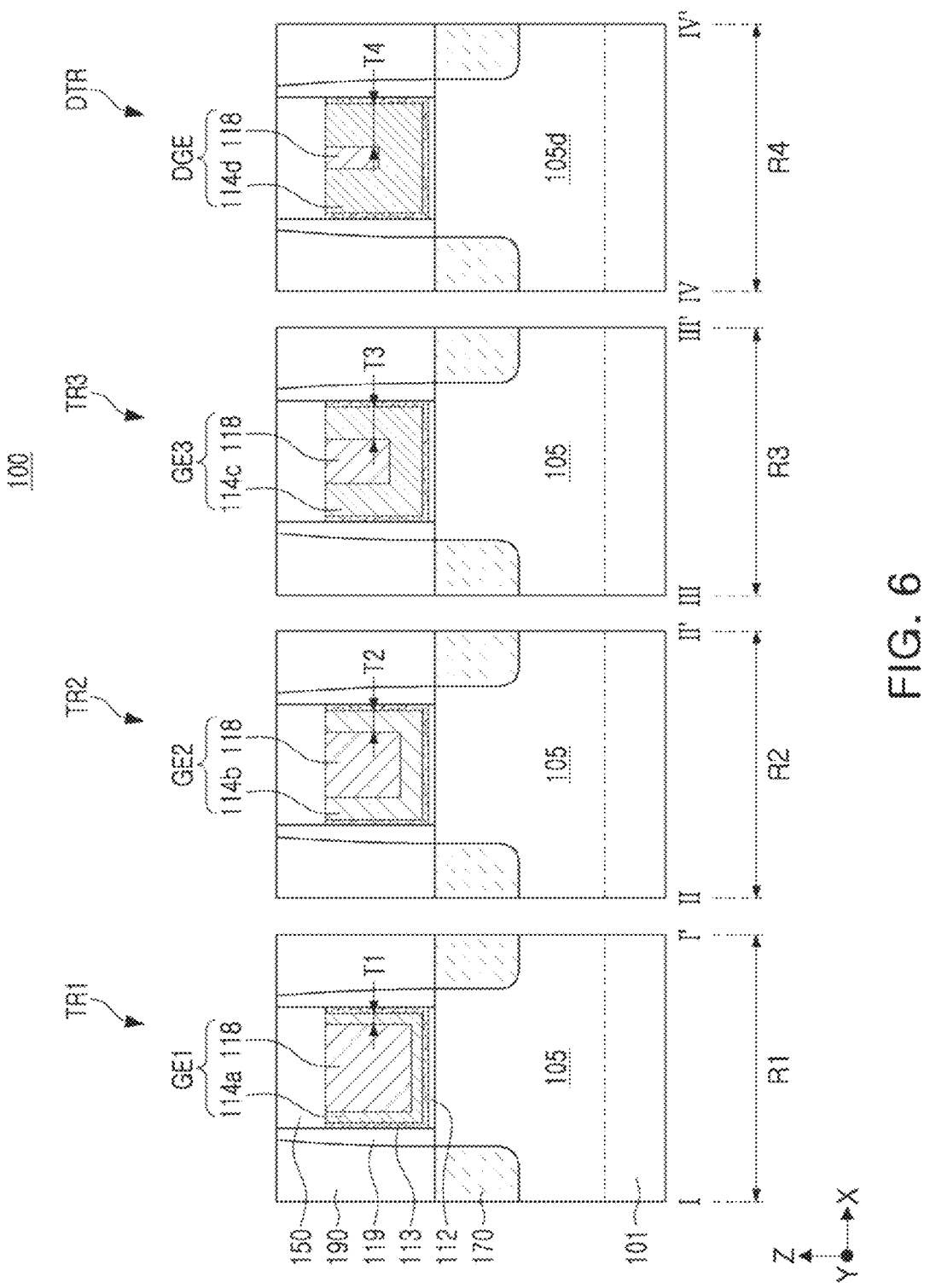
FIGS. 6 and 7 are schematic cross-sectional views of semiconductor devices according to an example embodiment.
Figure 7:
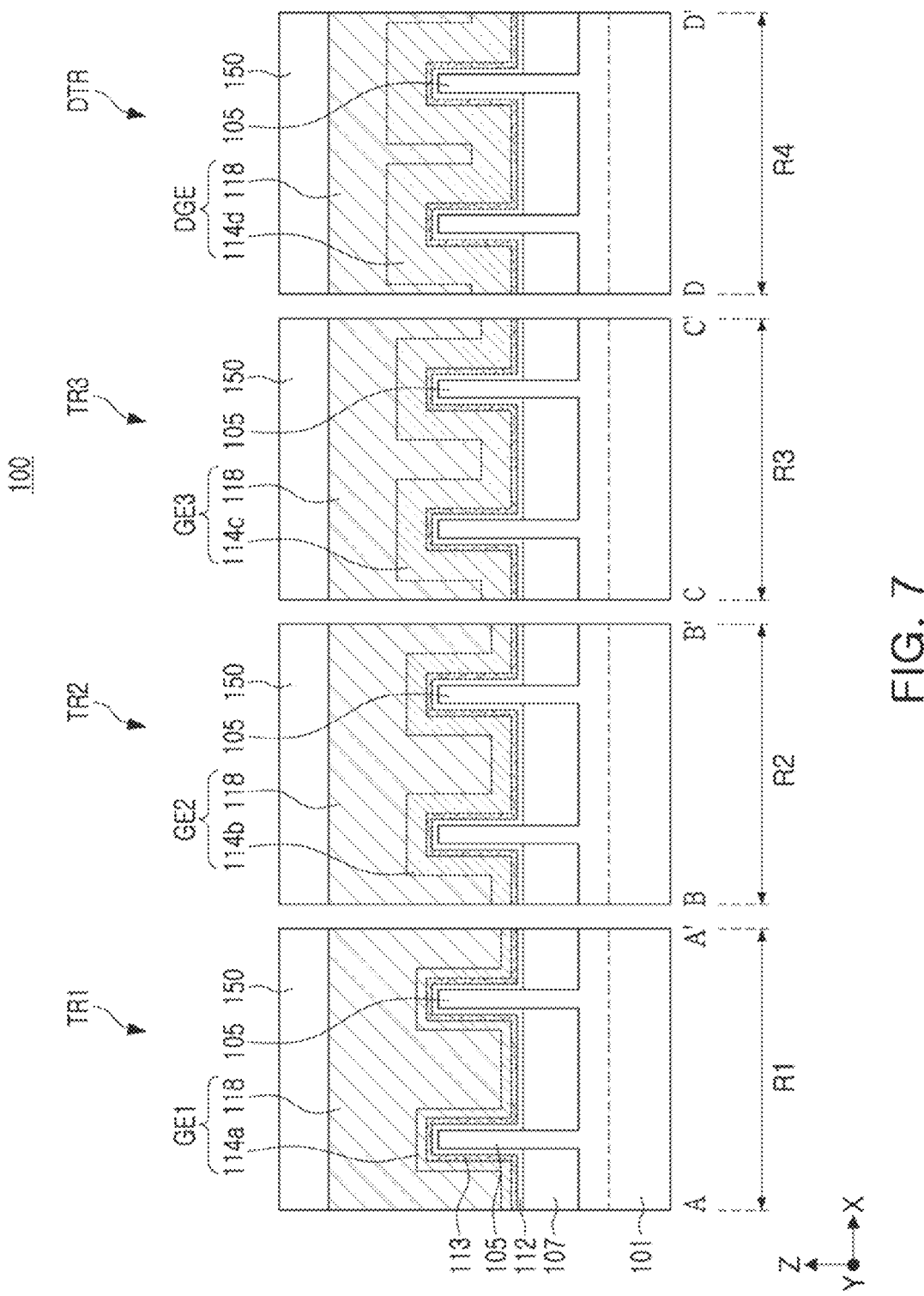

FIG. 5 is a schematic plan view of a semiconductor device according to an example embodiment. FIGS. 6 and 7 are schematic cross-sectional views of a semiconductor device according to an example embodiment. FIG. 6 shows cross-sectional views of the semiconductor device of FIG. 5 taken along lines I-I', II-II', III-III', and IV-IV', respectively. FIG. 7 shows cross-sectional views of the semiconductor device of FIG. 5 taken along lines A-A', B-B', C-C', and D-D', respectively. For convenience of explanation, only major components of the semiconductor device are illustrated in FIGS. 5 to 7.

Referring to FIGS. 5 to 7, a semiconductor device 100 may include a substrate 101 having first to fourth regions R1, R2, R3, and R4, active regions 105, source/drain regions 170, an interface layer 112, a gate dielectric layer 113, gate spacer layers 119, first to third gate electrode layers GE1, GE2, and GE3, and a dummy gate electrode layer DGE. The semiconductor device 100 may further include device separation layers 107, a gate capping layer 150, and an interlayer insulating layer 190.

The semiconductor device 100 may include fin field-effect transistor (FinFET) devices, which are transistors in which active regions 105 have a fin structure. The FinFET devices may include first to third transistors TR1, TR2, and TR3 arranged based on the active regions 105 and the first to third gate electrode layers GE1, GE2, and GE3 intersecting the active regions 105. For example, all of the first to third transistors TR1, TR2, and TR3 may be P-type MOS field effect transistors (MOSFET) or N-type MOS field effect transistors (MOSFET). Alternatively, the first to third transistors TR1, TR2, and TR3 may be a combination of the P-type MOSFET and the N-type MOSFET. The first to third transistors TR1, TR2, and TR3 may be transistors driven under different threshold voltages, and may constitute the same or different circuits in the semiconductor device 100.

However, according to some example embodiments, a semiconductor device may further include a plurality of channel layers spaced apart from each other in vertical direction. In the first to third transistors TR1, TR2 and TR3, the active regions 105 may have a fin structure and the first to third gate electrode layers GE1, GE2, and GE3 may be disposed between the active regions 105 and the lowermost channel layer, between the channel layers, and on top of the uppermost channel layer so that the first to third transistors TR1, TR2 and TR3 may be transistors having a multi-bridge channel FET (MBCFET™), which are gate-all-around (GAA)-type FETs.

The semiconductor device 100 may include a dummy transistor DTR disposed in a dummy region. The dummy transistor DTR may be a transistor formed in the dummy region while the first to third transistors TR1, TR2, and TR3 are manufactured, and the dummy transistor DTR may not function as a circuit device. For example, the dummy transistor DTR may not include a wiring structure such as a contact, or an electric signal may not be applied thereto even if the dummy transistor DTR includes a wiring structure.

In an example embodiment, the semiconductor device 100 may include a plurality of circuit function blocks including a plurality of standard cells spaced apart from each other and performing different circuit functions and a plurality of filler cells disposed between the plurality of standard cells, and may further include dummy regions between the plurality of circuit function blocks. The plurality of standard cells may correspond to the standard cells SC illustrated in the layout of FIG. 4, and the plurality of filler cells may correspond to the filler cells FC illustrated in the layout of FIG. 4. In addition, the dummy structures may correspond to the halo region HR illustrated in the layout of FIG. 4.

In an example embodiment, the plurality of standard cells may include a first standard cell including a plurality of first transistors TR1, a second standard cell including a plurality of second transistors TR2, and a third standard cell including a plurality of third transistors TR3. In an example embodiment, a plurality of dummy transistors DTR may be disposed in the plurality of filler cells or the dummy structures.

The substrate 101 may have first to fourth regions R1, R2, R3, and R4 different from each other, and the first to third regions R1, R2, and R3 may be regions in which the first to third transistors TR1, TR2, and TR3 are disposed, respectively, and the fourth region R4 may be a region in which the dummy transistor DTR is disposed. The first to fourth regions R1, R2, R3, and R4 may be spaced apart from each other or disposed to be adjacent to each other in the semiconductor device 100.

Referring to the layout diagram of FIG. 4 together, the first to third regions R1, R2, and R3 may correspond to regions in which standard cells SC of the circuit function blocks 50A, 50B, 50C, and 50D are disposed. The fourth region R4 may be a substrate region corresponding to the filler cells FC or the halo region HR disposed between the standard cells SC.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SOI) layer, or the like.

The device separation layers 107 may define the active regions 105 in the substrate 101 as illustrated in FIG. 7. The device separation layers 107 may be formed by, for example, a shallow trench isolation (STI) process. In some example embodiments, the device separation layers 107 may include a region extending deeper to a lower portion of the substrate 101 between adjacent active regions 105. According to some example embodiments, the device separation layers 107 may have a curved upper surface having a higher level toward to the active regions 105. However, the shapes of the upper and lower surfaces of the device separation layers 107 are not limited. The device separation layers 107 may be formed of an insulating material. The device separation layers 107 may be, for example, oxide, nitride, or a combination thereof.

The active regions 105 may be defined by the device separation layers 107 in the substrate 101 and may be disposed to extend in one direction, for example, the X-direction. The active regions 105 may have a line or bar shape protruding and extending from the substrate 101 between the device separation layers 107. Although FIG. 5 illustrates a pair of active regions 105 spaced apart from each other in the Y-direction in each of the first to third regions R1, R2, and R3, the arrangement shape, number, and width of the active regions 105 are not limited thereto. For example, one or three or more active regions 105 may be disposed in each of the first to third regions R1, R2, and R3, and active regions 105 having different widths may be disposed.

The active regions 105 may be formed as a part of the substrate 101, or may include an epitaxial layer grown from the substrate 101. The active regions 105 may be partially recessed from both sides of the first to third gate electrode layers GE1, GE2, and GE3, and source/drain regions 170 may be disposed in the recessed active regions 105. Accordingly, as illustrated in FIG. 7, the active regions 105 under the first to third gate electrode layers GE1, GE2, and GE3 may have a relatively high height respect to the device separation layers 107. In some example embodiments, the active regions 105 may include impurities.

In an example embodiment, the semiconductor device 100 may further include a dummy active region 105d disposed in lire fourth region R4. The dummy active region 105d is defined by the device separation layers 107 in the same manner as the active regions 105, and may be disposed to extend in one direction, for example, the X-direction. The dummy active region 105d may be disposed in the fourth region R4 to form the dummy transistor DTR. The dummy active region 105d may be disposed to be spaced apart from the active regions 105.

The source/drain regions 170 may be disposed on the active regions 105 at both sides of the first to third gate electrode layers GE1, GE2, and GE3. In an example embodiment, the source/drain regions 170 may be disposed on the dummy active region 105d at both sides of the dummy gate electrode layer DGE, but may not be disposed otherwise. The source/drain regions 170 may serve as a source region or a drain region of the first to third transistors TR1, TR2, and TR3. An upper surface of the source/drain regions 170 may be positioned to be the same as or similar to lower surfaces of the first to third gate electrode layers GE1, GE2, and GE3 or lower surfaces of the interface layer 112.

The source/drain regions 170 may be formed of an epitaxial layer and may include impurities. For example, the source/drain regions 170 may include P-type doped silicon germanium (SiGe). In some example embodiments, the source/drain regions 170 may include a plurality of regions including elements and/or doped elements having different concentrations.

In an example embodiment, the semiconductor device 100 may include first to third gate structures disposed on the first to third regions R1, R2, and R3, and a dummy disposed on the fourth region R4. Each of the first to third gate structures and the dummy gate structure may include an interface layer 112, a gate dielectric layer 113, gate spacer layers 119, and a gate capping layer 150. The first gate structure may further include a first gate electrode layer GE1 on the first region R1, the second gate structure may further include a second gate electrode layer GE2 on the second region R2, the third gate structure may further include a third gate electrode layer GE3 on the third region R3, and the dummy gate structure may further include a dummy gate electrode layer DGE on the fourth region R4.

The dummy gate structure may have a structure different from that of the first to third gate structures. In an example embodiment, the dummy gate electrode layer DGE may have a structure different from that of the first to third gate electrode layers GE1, GE2, and GE3.

The interface layer 112 and the gate dielectric layer 113 may be disposed between the active regions 105 and the first to third gate electrode layers GE1, GE2, and GE3 or between the dummy active region 105d and the dummy gate electrode layer DGE. The gate dielectric layer 113 may be disposed to cover the lower surface (e.g., bottom surface) and both side surfaces (e.g., outer surface) of the first to third gate electrode layers GE1, GE2, and GE3. Also, the gate dielectric layer 113 may be disposed to cover the lower surface (e.g., bottom surface) and both side surfaces (e.g., outer surface) of the dummy gate electrode layer DGE. However, in some example embodiments, the gate dielectric layer 113 may be formed only on the lower surfaces of the first to third gate electrode layers GE1, GE2, and GE3 and the dummy gate electrode layer DGE.

The interface layer 112 may be formed of a dielectric material, for example, a silicon oxide film, silicon oxynitride, or a combination thereof. The gate dielectric layer 113 may include oxide, nitride, or a high-k material. The high-k material may refer to a dielectric material having a dielectric constant higher than that of a silicon oxide layer ($SiO_2$). The high-k material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

In an example embodiment, the gate dielectric layer 113 may include the same material in the first to third transistors TR1, TR2, and TR3, but may include different materials according to some example embodiments. For example, the first to third transistors TR1, TR2, and TR3 may include gate dielectric layers formed of the same dielectric material and having different doped elements or different doping concentrations in the dielectric materials, respectively.

The gate spacer layers 119 may be disposed on both sides of the gate dielectric layer 113. The gate spacer layers 119 may insulate the source/drain regions 170, the first to third gate electrode layers GE1, GE2 and GE3, and the dummy gate electrode layer DGE. The gate spacer layers 119 may have a multilayer structure according to some example embodiments. The gate spacer layers 119 may be formed of oxide, nitride, or oxynitride, and in particular, a low-k film. In some example embodiments, the gate spacer layers 119 may not be disposed on the fourth region R4.

The first to third gate electrode layers GE1, GE2, and GE3 may be disposed to intersect the active regions 105 and extend in one direction, for example, the Y-direction, on the active regions. Channel regions of the first to third transistors TR1, TR2 and TR3 may be formed in the active regions 105 intersecting the first to third gate electrode layers GE1, GE2, and GE3. The dummy gate electrode layer DGE may be disposed to intersect the dummy active region 105d and extend in one direction, for example, the Y-direction, on the dummy active region 105d.

In an example embodiment, the dummy gate electrode layer DGE may have a structure, different from that of the first to third gate electrode layers GE1, GE2, and GE3. This is because, referring to FIG. 3, whether to open a plurality of masks M1, M2, M3, and M4 for the dummy regions D1, D2, D3, and D4 is arbitrarily changed to optimize a mask density (e.g., to have a desired mask density), in a Boolean table ('TABLE 2') on which a feedback operation has been performed. Accordingly, the dummy gate conductive layer 114d on the fourth region R4 may include a stack structure that is different from the first to third gate conductive layers 114a, 114b, and 114c on the first to third regions R1, R2, and R3 (e.g., a stack structure having different thicknesses).

In an example embodiment, at least one of the first to third gate conductive layers 114a, 114b, and 114c, for example, the first gate conductive layer 114a, may be formed by x deposition processes and m etching processes. Meanwhile, the dummy gate conductive layer 114d may be formed by x deposition processes and n etching processes. In the present disclosure, m and n refer to different natural numbers. Accordingly, when a material used for x deposition processes is the same material, the thicknesses of the first gate conductive layer 114a and the dummy gate conductive layer 114d may be different due to a difference between m etching processes to form the first gate conductive layer 114a and n etching processes to form the dummy gate conductive layer 114d.

For example, the first gate electrode layer GE1 may include a first gate conductive layer 114a disposed on the gate dielectric layer 113 and having a first thickness t1 and an upper conductive layer 118 on the first gate conductive layer 114a. The second gate electrode layer GE2 may include a second gate conductive layer 114b disposed on the gate dielectric layer 113 and having a second thickness t2 and the upper conductive layer 118 on the second gate conductive layer 114b. The third gate electrode layer GE3 may include a third gate conductive layer 114c disposed on the gate dielectric layer 113 and having a third thickness t3 and the upper conductive layer 118 on the third gate conductive layer 114c. The dummy gate electrode layer DGE may include a dummy gate conductive layer 114d disposed on the gate dielectric layer 113 and having a fourth thickness t4 and the upper conductive layer 118 on the dummy gate conductive layer 114d.

The first thickness t1 may be less than the second thickness t2, and the second thickness t2 may be less than the third thickness t3. The first to third transistors TR1, TR2, and TR3 may have different driving voltages and/or threshold voltages due to a difference in thickness of the first to third gate conductive layers 114a, 114b, and 114c. The fourth thickness t4 may be different from the first to third thicknesses t1, t2, and t3. For example, the fourth thickness t4 may have a thickness greater than the first to third thicknesses t1, t2, and t3.

The first to third gate conductive layers 114a, 114b, and 114c and the dummy gate conductive layer 114d may be layers containing a metal element, for example, titanium (Ti), tantalum (Ta), or titanium nitride (TiN), tantalum nitride (TaN), tungsten (W), lanthanum oxide (LaO), or a combination thereof. The dummy gate conductive layer 114d may include the same material as that of the first to third gate conductive layers 114a, 114b, and 114c. The first to third gate conductive layers 114a, 114b, and 114c and the dummy gate conductive layer 114d may be conformally disposed on the gate dielectric layer 113. Each of the first to third gate conductive layers 114a, 114b, and 114c and the dummy gate conductive layer 114d may have a substantially uniform thickness.

The upper conductive layer 118 may be disposed on the first to third gate conductive layers 114a, 114b, and 114c and the dummy gate conductive layer 114d, and may completely fill a region between the first to third gate conductive layers 114a, 114b, and 114c and the dummy gate conductive layer 114d and the gate capping layer 150. The upper conductive layer 118 may include a material, different from that of the first to third gate conductive layers 114a, 114b, and 114c and the dummy gate conductive layer 114d. For example, the upper conductive layer 118 may include TiN, TaN, W, WCN, or a combination thereof. However, in some example embodiments, the upper conductive layer 118 may include the same material as that of the first to third gate conductive layers 114a, 114b, and 114c and the dummy gate conductive layer 114d.

The gate capping layer 150 may be disposed to fill a region between the gate spacer layers 119 on the first to third gate electrode layers GE1, GE2, and GE3 and the dummy gate electrode layer DGE. The gate capping layer 150 may include at least one of an oxide, a nitride, or an oxynitride.

The interlayer insulating layer 190 may be disposed to cover the device separation layers 107, the source/drain regions 170, the first to third gate structures, and the dummy gate structure. The interlayer insulating layer 190 may include, for example, at least one of an oxide, a nitride, or an oxynitride, and may include a low-k material.

Figure 8:
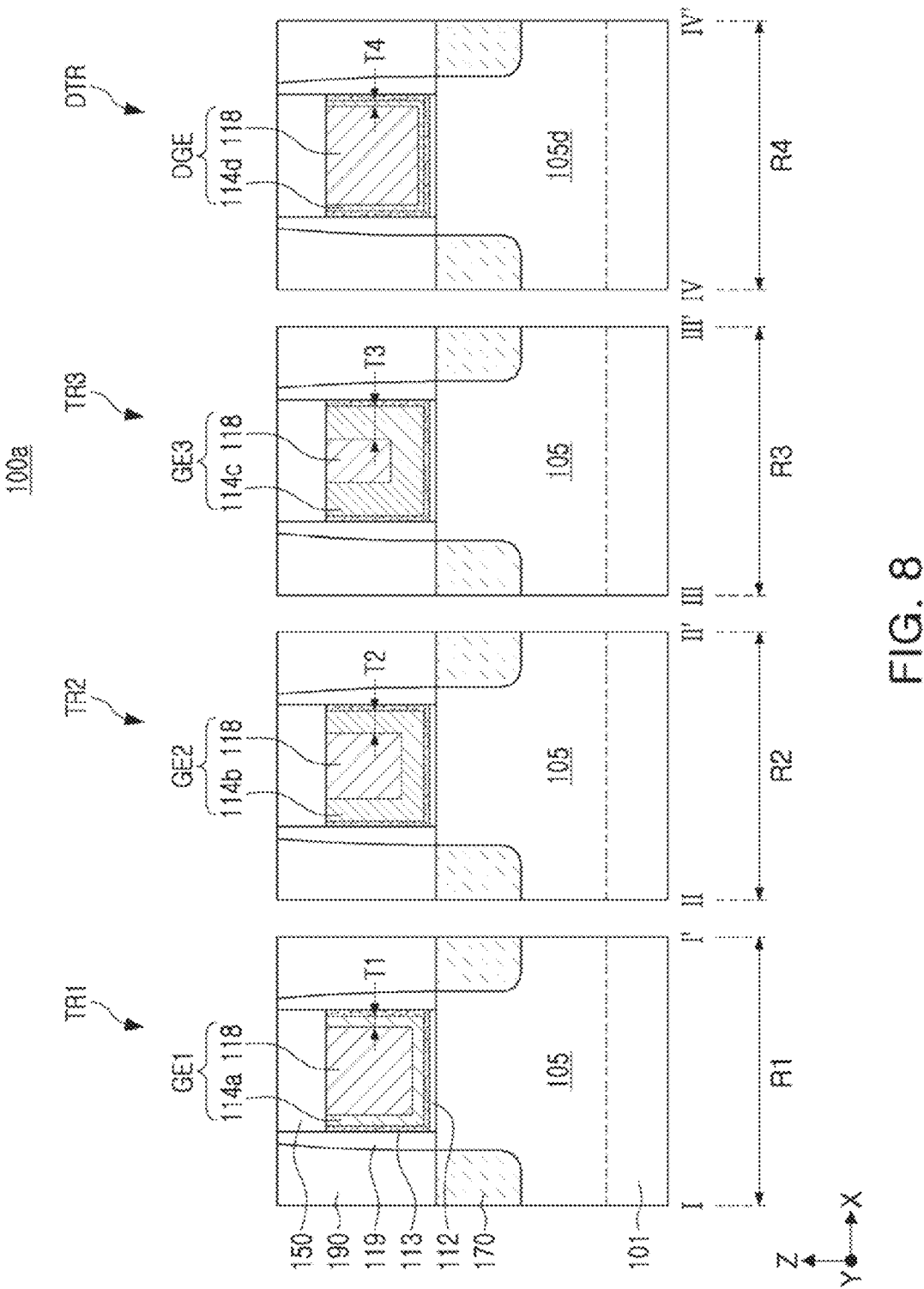
FIG. 8 is a schematic cross-sectional view of a semiconductor device according to an example embodiment.

FIG. 8 is a schematic cross-sectional view of a semiconductor device according to an example embodiment.

Referring to FIG. 8, a semiconductor device 100a may have a dummy gate conductive layer 114d structure, different from that of FIG. 6. Each of the first to third gate conductive layers 114a, 114b, and 114c may have first to third thicknesses t1, t2, and t3 which are the same as those in FIG. 6. Meanwhile, the dummy gate conductive layer 114d may have a fourth thickness t4 less than the smallest one (e.g., first thickness t1) among the first to third thicknesses t1, t2, and t3. This may be because, referring to FIG. 3 together, a conductive material on the fourth region R4 is formed to be relatively small (e.g., thin) in the process of arbitrarily changing whether to open the plurality of masks M1, M2, M3, and M4 for optimization of a mask density (or to adjust to have a desirable mask density).

In some example embodiments, a thickness of the dummy gate conductive layer 114d may be variously determined after a Boolean mask feedback operation is performed. Accordingly, the fourth thickness t4 may be a certain thickness between the first thickness t1 and the second thickness t2 or may be a certain thickness between the second thickness t2 and the third thickness.

Figure 9:
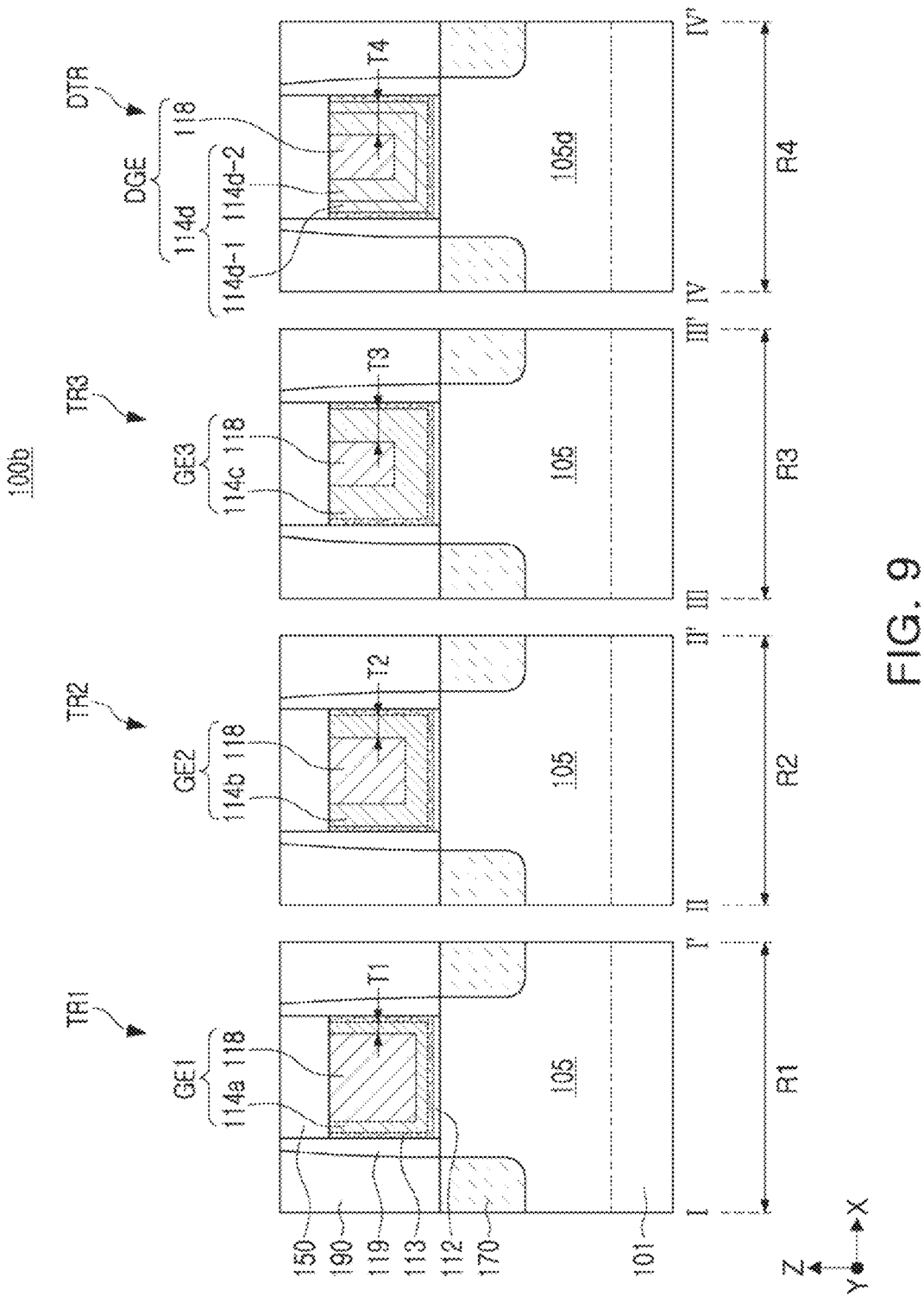
FIG. 9 is a schematic cross-sectional view of a semiconductor device according to an example embodiment.

FIG. 9 is a schematic cross-sectional view of a semiconductor device according to an example embodiment.

Referring to FIG. 9, a semiconductor device 100b may have a structure of the first to third gate conductive layers 114a, 114b, and 114c and the dummy gate conductive layer 114d, different from that of FIG. 6. The dummy gate conductive layer 114d may include a stack structure, different from that of the first to third gate conductive layers 114a, 114b, and 114c. The dummy gate conductive layer 114d may include a material, different from that of at least some of the first to third gate conductive layers 114a, 114b, and 114c. In some example embodiments, a material different from a reference material may include a material that does not contain the same element as that of the reference material, a material including the same element as that of the reference material and having a different composition, a material having the same element as that of the reference material and doped with a different element type, and a material having the same element as that of the reference material and having the same doped element type but different doping concentrations.

In an example embodiment, the first to third gate conductive layers 114a, 114b, and 114c may be a single layer having first to third thicknesses t1, t2, and t3, and the dummy gate conductive layer 114d may be a plurality of layers having the fourth thickness t4. The plurality of layers may include a first material layer 114d-1 and a second material layer 114d-2 having a material, different from that of the first material layer 114d-1. At least some of the first to third gate conductive layers 114a, 114b, and 114c may include different materials. The first material layer 114d-1 may include the same material as at least one of the first to third gate conductive layers 114a, 114b, and 114c. The second material layer 114d-2 may include the same material as at least one of the first to third gate conductive layers 114a, 114b and 114c. For example, the first material layer 114d-1 and the first gate conductive layer 114a may include the same material, and the second material layer 114d-2 and the second gate conductive layer 114b may include the same material. This may be because at least some of the plurality of masks M1, M2, M3, and M4 are masks for depositing a different material layer when referring to FIG. 3.

For example, when the first to third masks M1, M2, and M3 are masks for depositing and/or etching a first material and the fourth mask M4 is a mask for depositing and/or etching a second material, the fourth mask M4 may be set to form the second material only in the second and fourth regions R2 and R4 through the feedback operation of FIG. 3. Accordingly, the dummy gate conductive layer 114d may include a second material layer 114d-2 including a material, different from that of at least some of the first to third gate conductive layers 114a, 114b, and 114c. In addition, since whether to open the plurality of masks M1, M2, M3, and M4 on the fourth region R4 corresponding to the dummy regions D1, D2, D3, and D4 could be changed through the feedback operation of FIG. 3, the dummy gate conductive layer 114d may include a plurality of layers having different materials and/or different thicknesses from all of the first to third gate conductive layers 114a, 114b, and 114c.

However, unlike that illustrated in FIG. 9, according to some example embodiments, each of the first to third gate conductive layers 114a, 114b, and 114c may have a plurality of material layers including different materials, and the dummy gate conductive layer 114d may include a plurality of material layers having a material and thickness different from those of the first to third gate conductive layers 114a, 114b, and 114c or a plurality of material layers stacked in an order different from that of the first to third gate conductive layers 114a, 114b, and 114c.

Figure 10:
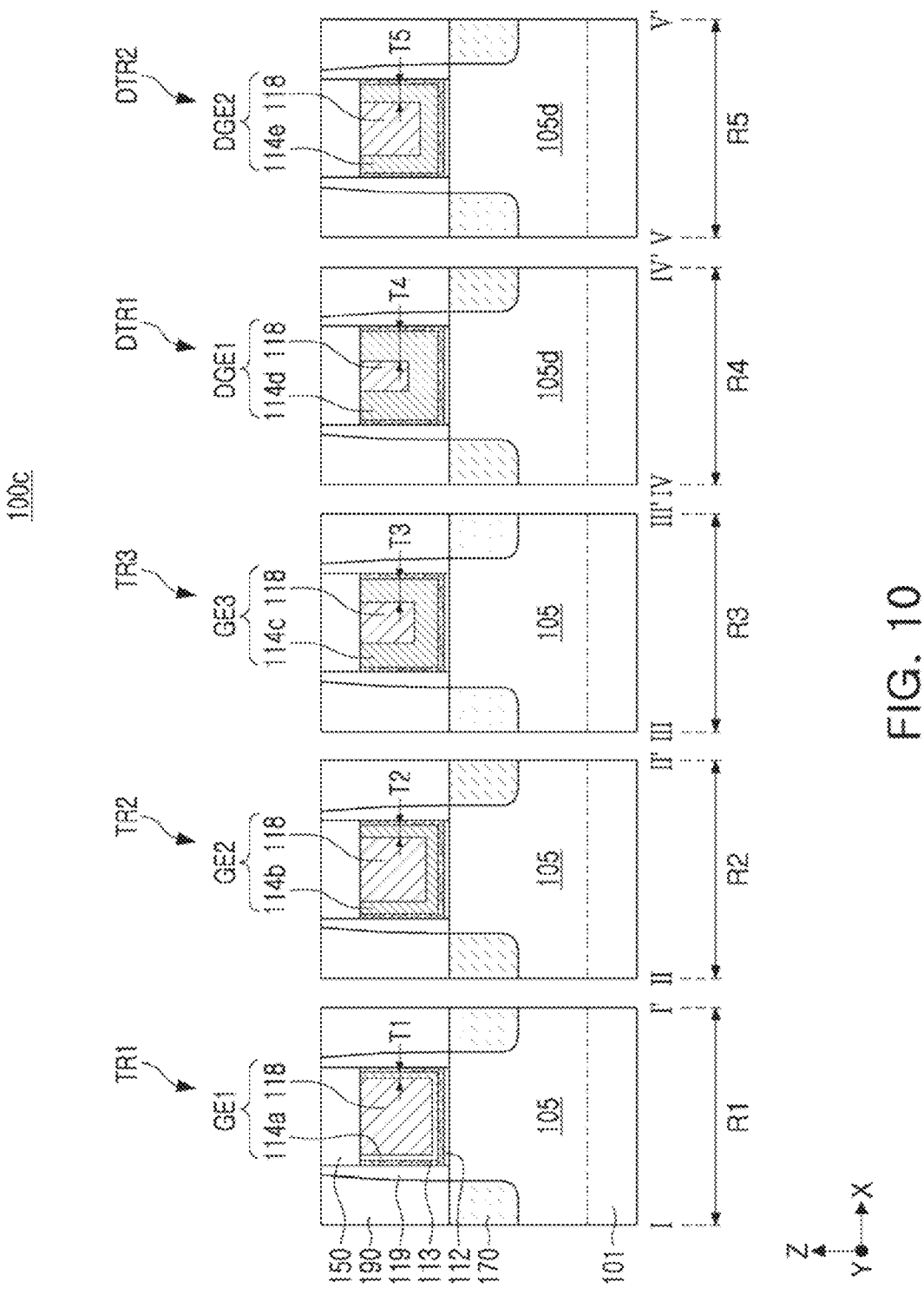
FIG. 10 is a schematic cross-sectional view of a semiconductor device according to an example embodiment.

FIG. 10 is a schematic cross-sectional view of a semiconductor device according to an example embodiment.

Referring to FIG. 10, a semiconductor device 100c may include a first dummy transistor DTR1 on the fourth region R4 and a second dummy transistor DTR2 on a fifth region R5.

The fourth and fifth regions R4 and R5 may be substrate regions corresponding to the filler cells FC or the halo region HR when referring to the layout diagram of FIG. 4 together. The fourth and fifth regions R4 and R5 may be spaced apart from each other or may be in contact with each other.

The semiconductor device 100c may include dummy active regions 105d disposed to extend in the X-direction and spaced apart from each other. The dummy active regions 105d may be defined by the device separation layers 107 in the same manner as the active regions 105 and may include impurities. In an example embodiment, the dummy active regions 105d may include a first dummy active region disposed in the fourth region R4 and a second dummy active region spaced apart from the first dummy active region and disposed in the fifth region R5.

In an example embodiment, the first dummy transistor DTR1 may include the first dummy active region, and a first dummy gate structure extending to intersect the first dummy active region and including a first dummy gate electrode layer DGE1. The second dummy transistor DTR2 may include the second dummy active region, and a second dummy gate structure extending to intersect the second dummy active region and including a second dummy gate electrode layer DGE2.

The first dummy gate electrode layer DGE1 may include a first dummy gate conductive layer 114d and an upper conductive layer 118 on the first dummy gate conductive layer 114d, and the second dummy gate electrode layer DGE2 may include a second dummy gate conductive layer 114e and an upper conductive layer 118 on the second dummy gate conductive layer 114e.

Each of the first to third gate conductive layers 114a, 114b, and 114c and the first and second dummy gate conductive layers 114d and 115e may have substantially a uniform thickness.

The fourth thickness t4 of the first dummy gate conductive layer 114d may be different from the first to third thicknesses t1, t2, and t3 of the first to third gate conductive layers 114a, 114b, and 114c. A fifth thickness t5 of the second dummy gate conductive layer 114e may be different from the fourth thickness t4.

FIGS. 11A to 11F are schematic cross-sectional views illustrating a method of manufacturing a semiconductor device according to an example embodiment.

Figure 11A:
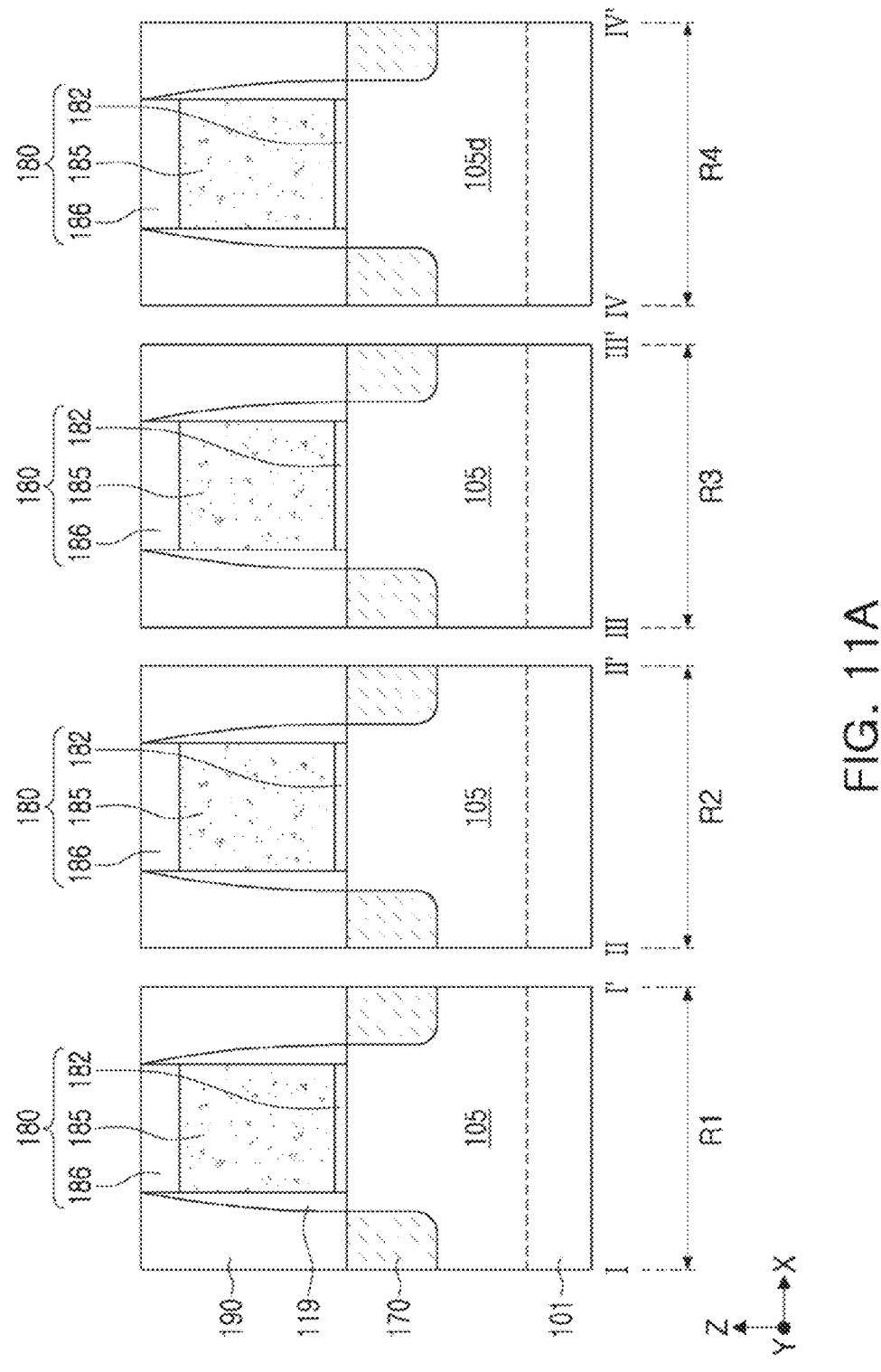
FIGS. 11A to 11F are schematic cross-sectional views illustrating a method of manufacturing a semiconductor device according to an example embodiment.

Referring to FIG. 11A, the substrate 101 having the first to fourth regions R1, R2, R3, and R4 may be patterned to form active regions 105 and a dummy active region 105d and to form sacrificial gate structures 180 and source/drain regions 170. Also, in this operation, gate spacer layers 119 and the interlayer insulating layer 190 may also be formed.

The first to third regions R1, R2, and R3 may be regions in which transistors having different driving voltages are disposed, and the fourth region R4 may be a dummy region. The active regions 105 and the dummy active region 105d may be defined by forming the device separation layers 107 (refer to FIG. 7), and may have a shape protruding from the substrate 101. The active regions 105 may include impurity regions, for example, N-type impurity regions.

The sacrificial gate structures 180 may be formed in a region in which the interface layer 112, the gate dielectric layer 113, the gate capping layer 150, the first to third gate electrode layers GE1, GE2, and GE3, and the dummy gate electrode layer DGE are disposed through a subsequent process as illustrated in FIG. 6. Each of the sacrificial gate structures 180 may include a sacrificial gate insulating layer 182, a sacrificial gate electrode layer 185, and a sacrificial gate capping layer 186. The sacrificial gate insulating layer 182 and the sacrificial gate capping layer 186 may be insulating layers, and the sacrificial gate electrode layer 185 may be a conductive layer, but the present inventive concepts are not limited thereto. For example, the sacrificial gate insulating layer 182 may include silicon oxide, the sacrificial gate electrode layer 185 may include polysilicon, and the sacrificial gate capping layer 186 may include at least one of a silicon oxide, a silicon nitride, or a silicon oxynitride.

The gate spacer layers 119 may be formed on both sidewalls of the sacrificial gate structures 180. The gate spacer layers 119 may be formed of a low-k material and may include, for example, at least one of SiO, SiN, SiCN, SiOC, SiON, or SiOCN.

The source/drain regions 170 may be formed on the active regions 105 recessed after a portion of the active regions 105 is removed from both sides of the gate spacer layers 119. The source/drain regions 170 may be formed using, for example, a selective epitaxial growth (SEG) process. The source/drain regions 170 may include a semiconductor material doped with impurities, for example, Si, SiGe, or SiC. In particular, the source/drain regions 170 may include P-type impurities. The impurities may be doped in-situ during formation of the source/drain regions 170 or may be implanted separately after growth. The source/drain regions 170 may be grown along a crystallographically stable plane during a growth process, so that a cross-section in a direction (not illustrated) may have a pentagonal, hexagonal, or similar shape, but the present inventive concepts are not limited thereto.

The interlayer insulating layer 190 may be formed by depositing an insulating material to cover the sacrificial gate structures 180 and the source/drain regions 170 and then exposing upper surfaces of the sacrificial gate structures 180 through a planarization process. The interlayer insulating layer 190 may include, for example, at least one of an oxide, a nitride, or an oxynitride, and may include a low-k material.

Figure 11B:
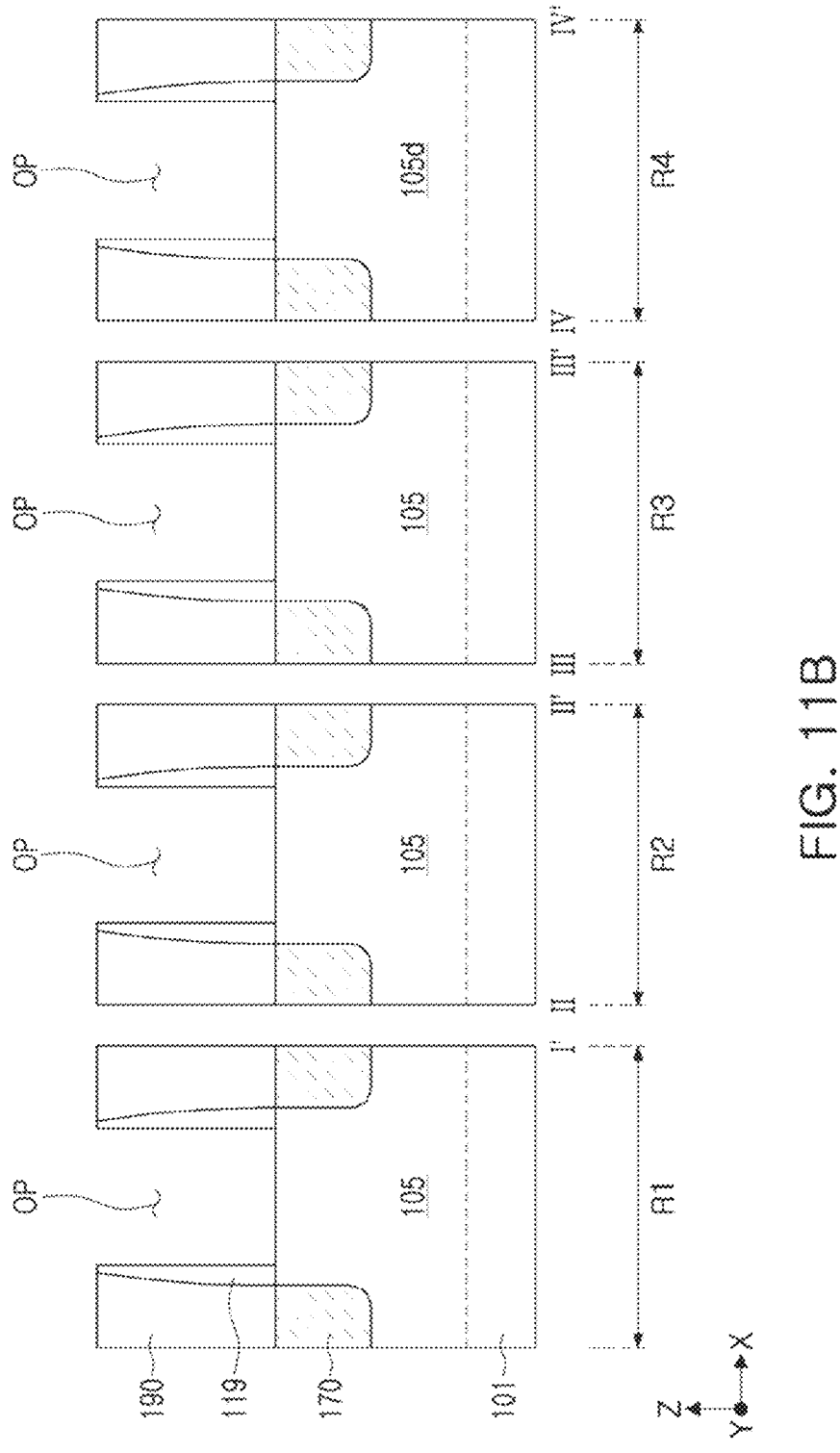

Referring to FIG. 11B, openings OP may be formed by removing the sacrificial gate structures 180.

The sacrificial gate structures 180 may be selectively removed with respect to the device separation layers 107 and the active regions 105 therebelow to form the openings OP exposing the device separation layers 107, the active regions 105, and the gate spacer layers 119. A removal process of the sacrificial gate structures 180 may use at least one of a dry etching process or a wet etching process.

Figure 11C:
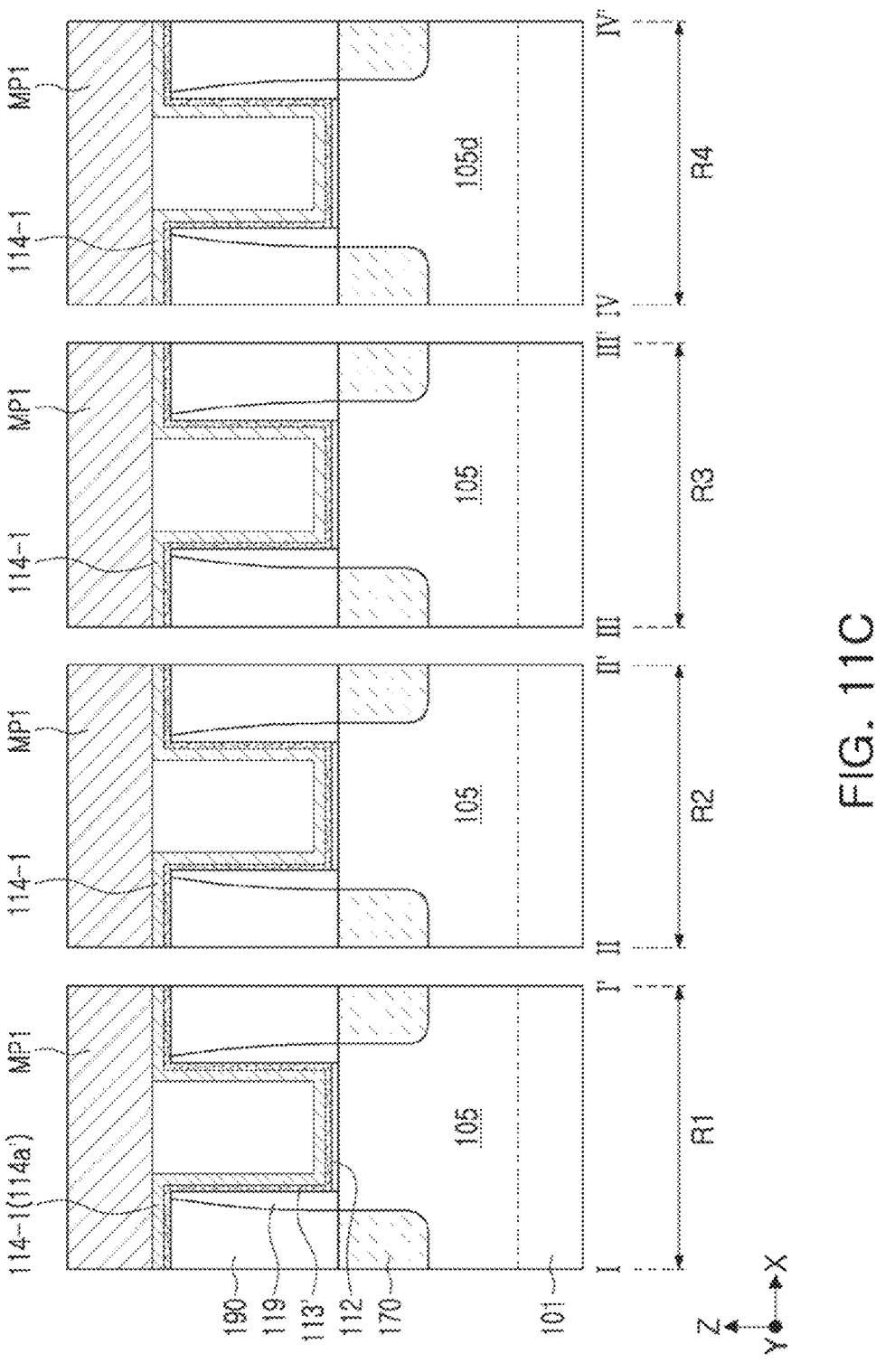

Referring to FIG. 11C, an interface layer 112 and a gate dielectric layer 113' may be formed, and a first conductive pattern 114-1 may be formed on the gate dielectric layer 113' using a first mask pattern MP1.

The interface layer 112 may be formed to have substantially the same thickness in the first to fourth regions R1, R2, R3, and R4. The interface layer 112 may be formed on upper surfaces of the active regions 105 exposed to bottom surfaces of the openings OP. In some example embodiments, the interface layer 112 may be formed by oxidizing a portion of the active regions 105. In some example embodiments, the interface layer 112 may be omitted.

The gate dielectric layer 113' may be formed to have substantially the same thickness in the first to fourth regions R1, R2, R3, and R4. The gate dielectric layer 113' may conformally cover side surfaces of the openings OP, an upper surface of the interface layer 112, and an upper surface of tire interlayer insulating layer 190.

Thereafter, a first conductive material layer having substantially the same thickness may be formed through u deposition process or the like. The first conductive material layer may conformally cover the gate dielectric layer 113'. The deposition process may be, for example, an atomic layer deposition (ALD) process. The first conductive material layer may include the same material as the first gate conductive layer 114*a* (refer to FIG. 6) to be formed through a subsequent process, and may have the same first thickness (t1 in FIG. 6) as the first gate conductive layer 114*a*. In an example embodiment, the first conductive material layer may include TiN, TaN, W, WCN, or a combination thereof.

Thereafter, the first mask pattern MP1 may be formed on the first to fourth regions R1, R2, R3, and R4. The first mask pattern MP1 may protect the first conductive material layer from a subsequent process. In an example embodiment, the first mask pattern MP1 may be an etch stop pattern layer formed through a mask for patterning the first conductive material layer. Referring to FIG. 2 together, the first mask pattern MP1 may be a pattern layer formed using at least one of the plurality of masks M1, M2, M3, and M4, for example, the first mask M1, on which feedback operation 32 has been performed. Accordingly, the first mask pattern MP1 may have a density within a desired (or alternatively, optimized) density range arbitrarily designated by the mask density verification method 30. The density may refer to a planar area of the first mask pattern MP1 compared to a planar area of the substrate 101. That is, the first mask pattern MP1 may be formed in all regions overlapping the first to fourth regions R1, R2, R3, and R4, but may not be formed in other regions of the substrate 101.

Thereafter, the first conductive material layer on the region in which the first mask pattern MP1 is not formed may be removed by performing an etching process to form the first conductive pattern 114-1. That is, the first mask pattern MP1 may serve to protect the first conductive material layer on the first to fourth regions R1, R2, R3, and R4 from the etching process.

In an example embodiment, as separate conductive patterns are not additionally formed through a subsequent process, the first conductive pattern 114-1 on the first region R1 may form a first gate conductive layer 114*a'*.

In an example embodiment, the first conductive pattern 114-1 may be formed on the gate dielectric layer 113'. In some example embodiments, a portion of the gate dielectric layer 113' on the interlayer insulating layer 190 may be removed by performing an etching process on the gate dielectric layer 113', and then the first conductive pattern 114-1 may be formed.

Figure 11D:
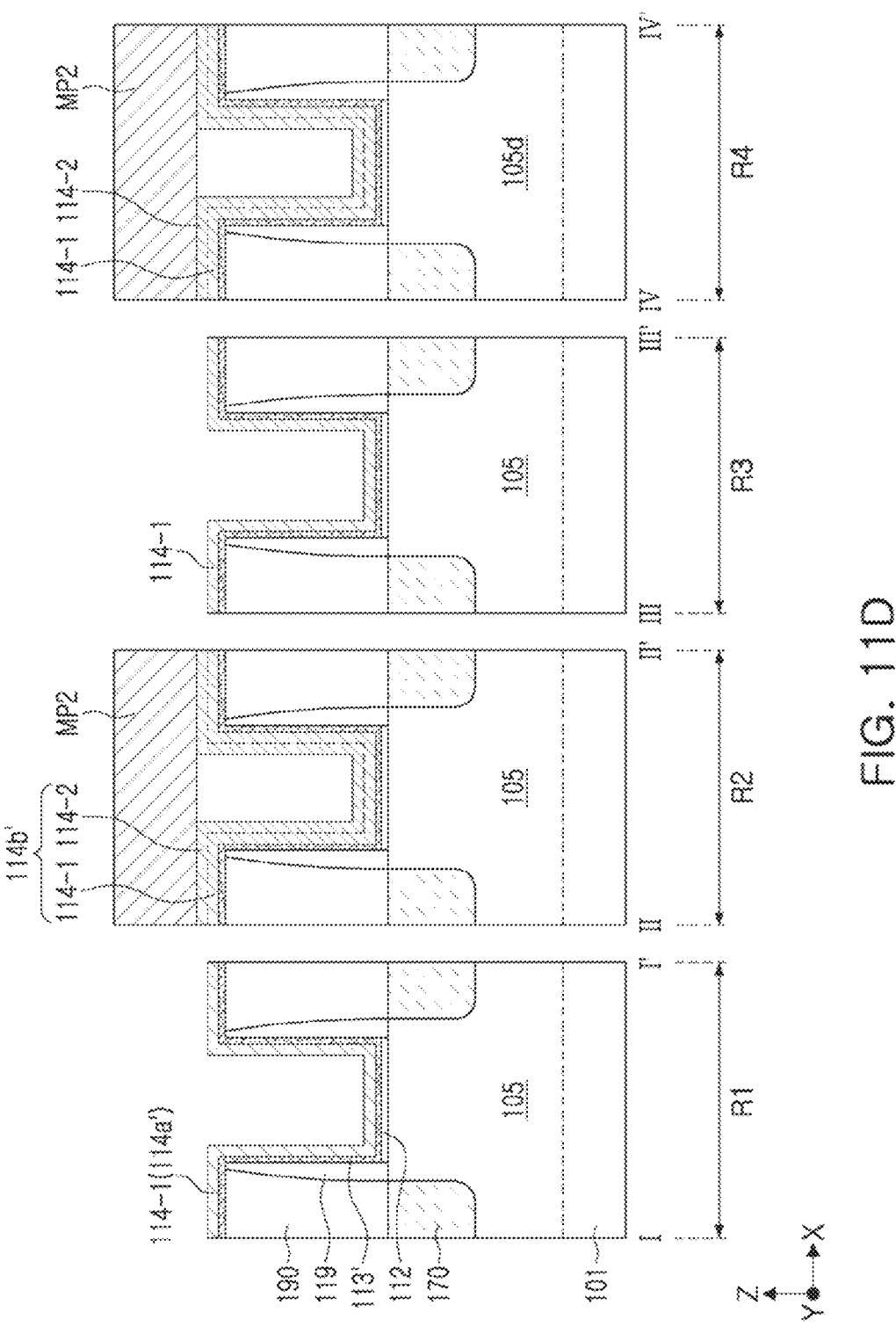

Referring to FIG. 11D, a second conductive pattern 114-2 may be formed using a second mask pattern MP2.

First, the first mask pattern MP1 may be removed, and a second conductive material layer having substantially the same thickness may be formed on the first to fourth regions R1, R2, R3, and R4 through a deposition process or the like. In an example embodiment, the second conductive material layer may include TiN, TaN, W, WCN, or a combination thereof.

Next, the second mask pattern MP2 may be formed on the second and fourth regions R2 and R4. The second mask pattern MP2 may protect the second conductive material layer in a subsequent process. In an example embodiment, the second mask pattern MP2 may be an etch stop pattern layer formed through a mask for patterning the second conductive material layer. Referring to FIG. 2 together, the second mask pattern MP2 may be a pattern layer formed using at least one of the plurality of masks M1, M2, M3, and M4 (for example, the second mask M2) on which feedback operation 32 has been performed. Accordingly, the second mask pattern MP2 may have a density within a desired (or alternatively, optimized) density range arbitrarily designated by the mask density verification method 30. The density may refer to a planar area of the second mask pattern MP2 compared to a planar area of the substrate 101.

Thereafter, the second conductive material layer on the first and third regions R1 and R3 in which the second mask pattern MP2 is not formed may be removed by performing an etching process to form the second conductive pattern 114-2. That is, the second mask pattern MP2 may serve to protect the second conductive material layer on the second and fourth regions R2 and R4 from the etching process.

In an example embodiment, a boundary between the first conductive pattern 114-1 and the second conductive pattern 114-2 may not be distinguished as the first conductive pattern 114-1 and the second conductive pattern 114-2 include the same material, but the present inventive concepts are not limited thereto. According to some example embodiments, the first conductive pattern 114-1 and the second conductive pattern 114-2 may include different materials, or a boundary therebetween may be distinguished even if the first conductive pattern 114-1 and the second conductive pattern 114-2 include the same material.

In an example embodiment, the first conductive pattern 114-1 and the second conductive pattern 114-2 on the second region R2 may form a second gate conductive layer 114b', and the second gate conductive layer 114b' may have a second thickness t2 greater than the first thickness t1 of the first gate conductive layer 114a'.

Figure 11E:
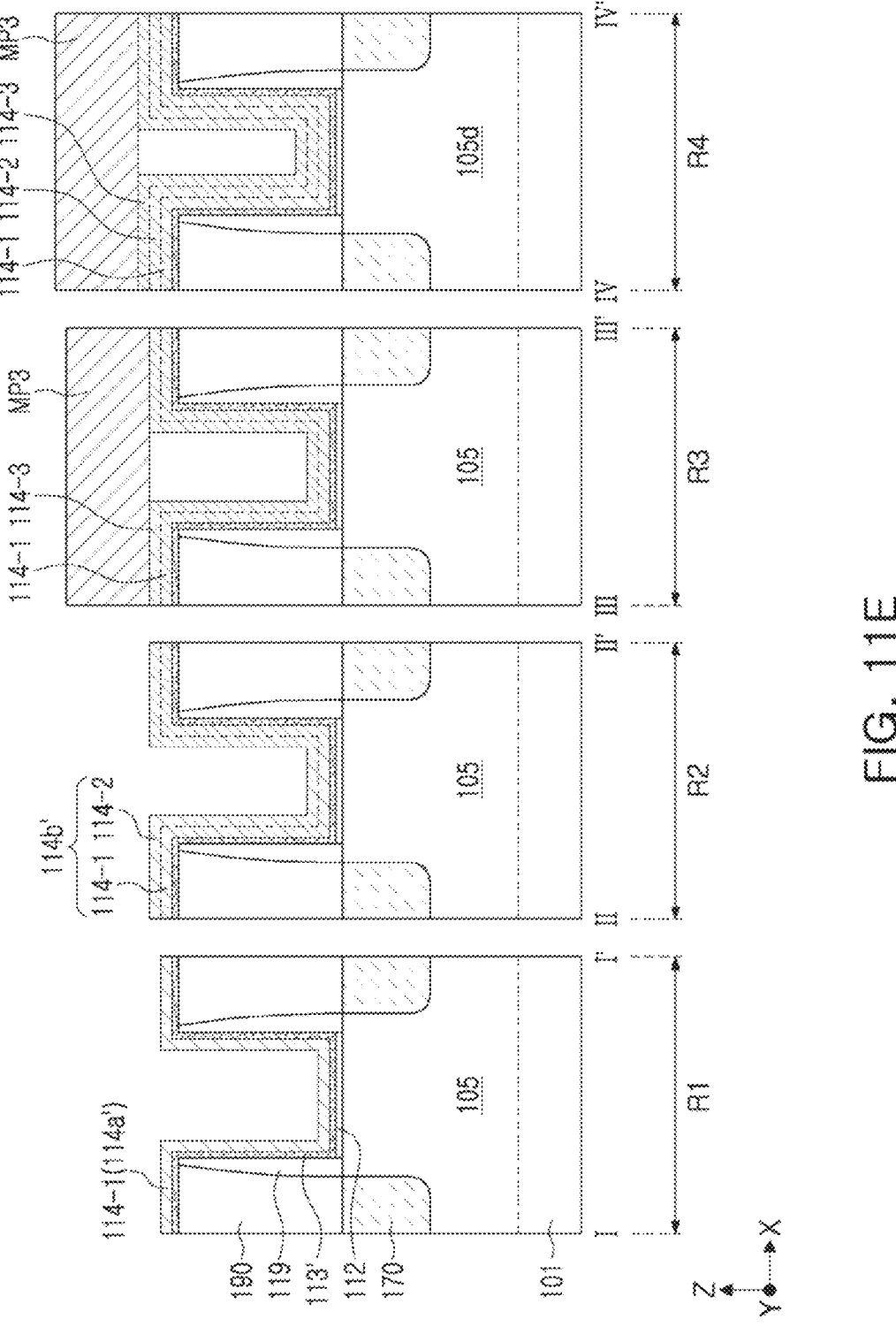

Referring to FIG. 11E, a third conductive pattern 114-3 may be formed using the third mask pattern MP3.

First, the second mask pattern MP2 may be removed, and a third conductive material layer having substantially the same thickness may be formed on the first to fourth regions R1, R2, R3, and R4 through a deposition process or the like. In an example embodiment, the third conductive material layer may include TiN, TaN, W, WCN, or a combination thereof.

Thereafter, the third mask pattern MP3 may be formed on the third and fourth regions R3 and R4. The third mask pattern MP3 may protect the third conductive material layer from a subsequent process. In an example embodiment, the third mask pattern MP3 may be an etch stop pattern layer formed through a mask for patterning the third conductive material layer. Referring to FIG. 2 together, the third mask pattern MP3 may be a pattern layer formed using at least one of the plurality of masks M1, M2, M3 and M4 (for example, the third mask M3) on which feedback operation 32 has been performed. Accordingly, the third mask pattern MP3 may have a density within a desired (or alternatively, optimized) density range arbitrarily designated by the mask density verification method 30. The density may refer to a planar area of the third mask pattern MP3 compared to a planar area of the substrate 101.

Next, the third conductive material layer on the first and second regions R1 and R2 in which the third mask pattern MP3 is not formed may be removed by performing an etching process to form a third conductive pattern 114-3. That is, the third mask pattern MP3 may serve to protect the third conductive material layer on the third and fourth regions R3 and R4 from the etching process.

In an example embodiment, a boundary between the second conductive pattern 114-2 and the third conductive pattern 114-3 may not be distinguished as the second conductive pattern 114-2 and the third conductive pattern 114-3 include the same material, but the present inventive concepts are not limited thereto, and according to some example embodiments, the second conductive pattern 114-2 and the third conductive pattern 114-3 may include different materials, or a boundary therebetween may be distinguished even if the second conductive pattern 114-2 and the third conductive pattern 114-3 include the same material.

Figure 11F:
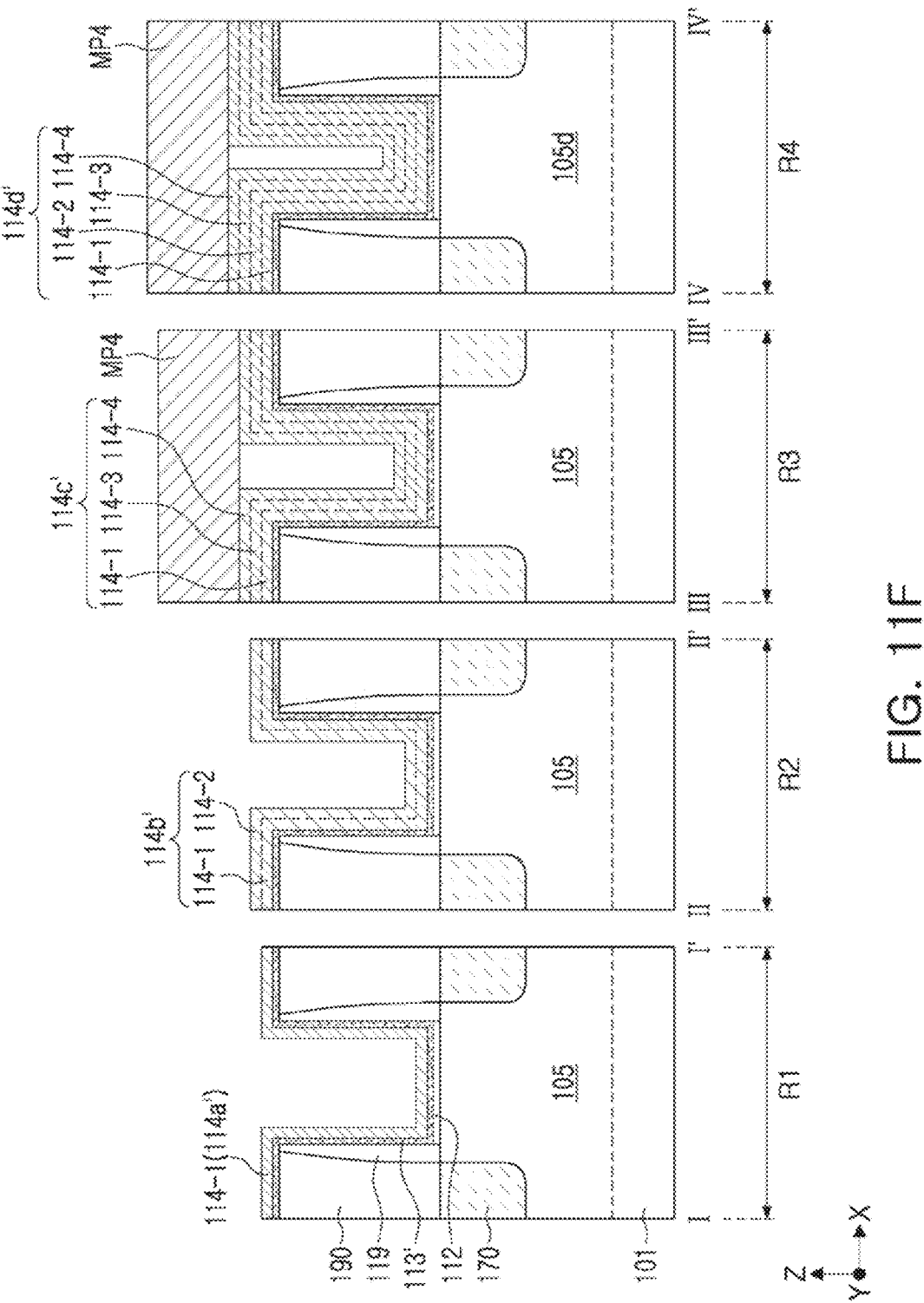

Referring to FIG. 11F, a fourth conductive pattern 114-4 may be formed using the fourth mask pattern MP4.

First, the third mask pattern MP3 may be removed, and a fourth conductive material layer having substantially the same thickness may be formed on the first to fourth regions R1, R2, R3, and R4 through a deposition process or the like. In an example embodiment, the fourth conductive material layer may include TiN, TaN, W, WCN, or a combination thereof.

Thereafter, the fourth mask pattern MP4 may be formed on the third and fourth regions R3 and R4. The fourth mask pattern MP4 may protect the fourth conductive material layer from a subsequent process. In an example embodiment, the fourth mask pattern MP4 may be an etch stop pattern layer formed through a mask for patterning the third conductive material layer. Referring to FIG. 2 together, the fourth mask pattern MP4 may be a pattern layer formed using at least one of the plurality of masks M1, M2, M3 and M4 (for example, the fourth mask M4) on which feedback operation 32 has been performed. Accordingly, the fourth mask pattern MP4 may have a density within a desired tor alternatively, optimized) density range arbitrarily designated by the mask density verification method 30. The density may refer to a planar area of the fourth mask pattern MP4 compared to a planar area of the substrate 101.

Next, the fourth conductive material layer on the first and second regions R1 and R2 in which the fourth mask pattern MP4 is not formed may be removed by performing an etching process to form a fourth conductive pattern 114-4. That is, the fourth mask pattern MP4 may serve to protect the fourth conductive material layer on the third and fourth regions R3 and R4 from the etching process.

In an example embodiment, a boundary between the third conductive pattern 114-3 and the fourth conductive pattern 114-4 may not be distinguished as the second conductive pattern 114-2 and the third conductive pattern 114-3 include the same material, but the present inventive concepts are not limited thereto, and according to some example embodiments, the third conductive pattern 114-3 and the fourth conductive pattern 114-4 may include different materials, or a boundary therebetween may be distinguished even if the third conductive pattern 114-3 and the fourth conductive pattern 114-4 include the same material.

In an example embodiment, the first conductive pattern 114-1, the third conductive pattern 114-3, and the fourth conductive pattern 114-4 on the third region R4 may form a third gate conductive layer 114c', and the third gate conductive layer 114c' may have a third thickness t3 greater than the second thickness t2 of the second gate conductive layer 114b'.

In an example embodiment, the first conductive pattern 114-1, the second conductive pattern 114-2, the third conductive pattern 114-3, and the fourth conductive pattern 114-4 on the fourth region R4 may form the dummy gate conductive layer 114d', and the dummy gate conductive layer 114d' may have a fourth thickness t4 greater titan the third thickness t3 of the third gate conductive layer 114c'.

In FIGS. 11C to 11F, the first to fourth conductive patterns 114-1, 114-2, 114-3, and 114-4 have been described to have a same thickness and include a same material, to describe by way of example the dummy gate conductive layer 114d' having a stack structure that are different from that of the first to third gate conductive layers 114a', 114b', and 114c'. According to some example embodiments, the thickness and materials of the first to fourth conductive patterns 114-1, 114-2, 114-3, and 114-4 may be variously changed.

In addition, the arrangement relationship and process order of the mask patterns MP1, MP2, MP3, and MP4 described in FIGS. 11C to 11F are merely examples to describe the semiconductor device 100 formed by masks having a desired (or alternatively, optimized) mask density, and the arrangement relationship and process order of the mask patterns MP1, MP2, MP3, and MP4 may be variously changed.

Accordingly, the dummy gate conductive layer 114*d'* may have various stack structures different from those of the first to third gate conductive layers 114*a'*, 114*b'*, and 114*c'*. For example, the dummy gate conductive layer 114*d'* may be a fourth thickness less than the first thickness t1 and between the second thickness t2 and the third thickness t3. In some example embodiments, the dummy gate conductive layer 114*d'* may include conductive patterns slacked in order different from that of the first to third gate conductive layers 114*a'*, 114*b'* and 114*c'*.

Next, referring to FIG. 6 together, the first to third gate conductive layers 114*a'*, 114*b'*, and 114*c'* and a portion of the dummy gate conductive layer 114*d'* disposed on the interlayer insulating layer 190 may be removed, and tire upper conductive layer 118 and the gate capping layer 150 may be formed to form the semiconductor device 100 of FIGS. 5 to 7.

A semiconductor device having improved production yield and improved electrical characteristics may be provided by adjusting a mask density desired for forming gate structures of standard cells having various threshold voltages.

While some example embodiments have been illustrated and described above, it will be apparent to those skilled in the art that modifications and variations could be made without departing from the scope of the present inventive concepts as defined by the appended claims.

What is claimed is:

1. A semiconductor device comprising:
a substrate having first to fourth regions;
first to third active regions extending on the first to third regions, respectively;
a first dummy active region extending on the fourth region;
a first gate structure intersecting the first active region on the first region, the first gate structure including a first gate conductive layer;
a second gate structure intersecting the second active region on the second region, the second gate structure including a second gate conductive layer;
a third gate structure intersecting the third active region on the third region, the third gate structure including a third gate conductive layer;
a first dummy gate structure intersecting the first dummy active region on the fourth region, the first dummy gate structure including a first dummy gate conductive layer to which an electrical signal is not applied; and
source/drain regions on the first to third active regions and on both sides of the first to third gate structures,
wherein the first dummy gate conductive layer has a thickness that is different from thicknesses of the first to third gate conductive layers,
the first to third gate structures are in corresponding ones of a plurality of standard cells, respectively,
the first dummy gate conductive layer is in a respective filler cell between a corresponding pair of the plurality of standard cells, and the first dummy gate conductive layer is configured to have different thicknesses depending on a location thereof.

2. The semiconductor device of claim 1, wherein the first dummy gate conductive layer includes a same material as a material of the first to third gate conductive layers.

3. The semiconductor device of claim 2, wherein the first dummy gate conductive layer and the first to third gate conductive layers include at least one of titanium (Ti), tantalum (Ta), titanium nitride (TiN), tantalum nitride (TaN), or lanthanum oxide (LaO).

4. The semiconductor device of claim 1, wherein each of the first dummy gate conductive layer and the first to third gate conductive layers has a uniform thickness.

5. The semiconductor device of claim 1, wherein
the first gate conductive layer has a first thickness,
the second gate conductive layer has a second thickness greater than the first thickness,
the third gate conductive layer has a third thickness greater than the second thickness, and
the first to third gate structures constitutes transistors having different threshold voltages.

6. The semiconductor device of claim 5, wherein the first dummy gate conductive layer has a fourth thickness greater than the third thickness.

7. The semiconductor device of claim 5, wherein the first dummy gate conductive layer has a fourth thickness less than the first thickness.

8. The semiconductor device of claim 5, wherein
the substrate further includes a fifth region, and
the semiconductor device further comprises,
a second dummy active region extending on the fifth region, and
a second dummy gate structure extending to intersect the second dummy active region on the fifth region, the second dummy gate structure having a second dummy gate conductive layer, and
the second dummy gate conductive layer has a fifth thickness that is different from a fourth thickness of the first dummy gate conductive layer.

9. The semiconductor device of claim 8, wherein the fifth thickness is different from the first to third thicknesses.

10. The semiconductor device of claim 1, wherein each of the first to third gate structures includes a gate dielectric layer covering outer and bottom surfaces of the first to third gate conductive layers, a gate capping layer on the first to third gate conductive layers, an upper conductive layer covering inner surfaces of the first to third gate conductive layers, and gate spacer layers on side surfaces of the gate dielectric layer.

11. The semiconductor device of claim 10, wherein the first dummy gate structure includes the gate dielectric layer covering outer and bottom surfaces of the first dummy gate conductive layer, the gate capping layer on the first dummy gate conductive layer, the upper conductive layer covering an inner side surface of the first dummy gate conductive layer, and the gate spacer layers on the side surfaces of the gate dielectric layer.

12. The semiconductor device of claim 1, further comprising:
a plurality of channel layers spaced apart from each other in a vertical direction on the first to third regions, the vertical direction being perpendicular to the substrate,
wherein the first to third gate structures intersect corresponding ones of the first to third active regions and corresponding ones of the plurality of channel layers, respectively, and the source/drain regions are in contact with the plurality of channel layers, respectively.

13. A semiconductor device comprising:

a substrate;

a plurality of circuit function blocks including a plurality of standard cells and a plurality of filler cells interposed between the plurality of standard cells, the plurality of standard cells spaced apart from each other on the substrate and configured to perform different circuit functions, respectively; and a dummy structure between the plurality of circuit function blocks on the substrate, wherein the plurality of standard cells each include an active region, a gate structure intersecting the active region, and source/drain regions on the active region and on both sides of the gate structure, the plurality filler cells each include a first dummy active region and a first dummy gate structure intersecting the first dummy active region, the dummy structure includes a second dummy active region and a second dummy gate structure, the second dummy gate structure including a dummy gate conductive layer and intersecting the second dummy active region, the gate structure has a structure that is different from at least one of the first dummy gate structure or the second dummy gate structure, the dummy gate conductive layer is in a respective filler cell between a corresponding pair of the plurality of standard cells, and the dummy gate conductive layer is configured to have different thicknesses depending on a location thereof.

14. The semiconductor device of claim 13, wherein the gate structure includes a gate conductive layer, the first dummy gate structure includes a first dummy gate conductive layer, the first dummy gate conductive layer including a same material as the gate conductive layer, the second dummy gate structure includes a second dummy gate conductive layer, the second dummy gate conductive layer including a same material as the gate conductive layer, and each of the gate conductive layer and the first and second dummy gate conductive layers has a uniform thickness.

15. The semiconductor device of claim 14, wherein a first thickness of the gate conductive layer is different from a second thickness of the first dummy gate conductive layer, and a third thickness of the second dummy gate conductive layer is different from the first thickness and the second thickness.

16. The semiconductor device of claim 13, wherein the plurality of standard cells include first to third standard cells, the first to third standard cells including transistors having different threshold voltages, respectively, the first standard cell includes a first gate structure having a first gate conductive layer, the second standard cell includes a second gate structure having a second gate conductive layer, the third standard cell includes a third gate structure having a third gate conductive layer, and the first dummy gate structure includes a first dummy gate conductive layer.

17. The semiconductor device of claim 16, wherein the first to third gate conductive layers and the first dummy gate conductive layer have different thicknesses from each other.

18. The semiconductor device of claim 16, wherein the first dummy gate conductive layer includes a first material layer and a second material layer including a material different from the first material layer, the first material layer includes a same material as a material of at least one of the first to third gate conductive layers, and the second material layer includes a same material as a material of at least one of the first to third gate conductive layers.

19. A semiconductor device comprising:

a substrate having first to fourth regions;

a first gate structure on the first region, the first gate structure including a sequentially stacked structure of a gate dielectric layer, a first gate conductive layer, and an upper conductive layer, a gate capping layer on the upper conductive layer, and gate spacer layers on sidewalls of the gate dielectric layer;

a second gate structure on the second region, the second gate structure including a sequentially stacked structure of the gate dielectric layer, a second gate conductive layer, and the upper conductive layer, the gate capping layer on the upper conductive layer, and the gate spacer layers on the sidewalls of the gate dielectric layer;

a third gate structure on the third region, the third gate structure including a sequentially stacked structure of the gate dielectric layer, a third gate conductive layer, and the upper conductive layer, the gate capping layer on the upper conductive layer, and the gate spacer layers on the sidewalls of the gate dielectric layer; and a dummy gate structure on the fourth region, the dummy gate structure including a sequentially stacked structure of the gate dielectric layer, a dummy gate conductive layer, and the upper conductive layer, the gate capping layer on the upper conductive layer, and the gate spacer layers on the sidewalls of the gate dielectric layer, wherein the first to third gate conductive layers and the dummy gate conductive layer include a same material, the first to third gate conductive layers and the dummy gate conductive layer have thicknesses different from each other, the first to third gate structures are in corresponding ones of a plurality of standard cells, respectively, the dummy gate conductive layer is in a respective filler cell between a corresponding pair of the plurality of standard cells, and the dummy gate conductive layer is configured to have different thicknesses depending on a location thereof.

20. The semiconductor device of claim 19, wherein the substrate includes circuit regions and a dummy region, the circuit regions including the plurality of standard cells that are spaced apart from each other and configured to perform different circuit functions, respectively, the first to third regions are partial regions of the circuit regions, respectively, and the fourth region is a partial region of the dummy region.

* * * * *